(12) United States Patent
Sorbom et al.

(10) Patent No.: US 11,783,953 B2
(45) Date of Patent: Oct. 10, 2023

(54) CRYOGENIC RADIATION ENHANCEMENT OF SUPERCONDUCTORS

(71) Applicant: Massachusetts Institute of Technology, Cambridge, MA (US)

(72) Inventors: Brandon Nils Sorbom, Cambridge, MA (US); Zachary Hartwig, Jamaica Plain, MA (US); Dennis G. Whyte, Brookline, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 1136 days.

(21) Appl. No.: 16/444,467

(22) Filed: Jun. 18, 2019

(65) Prior Publication Data
US 2020/0350083 A1    Nov. 5, 2020

Related U.S. Application Data

(60) Provisional application No. 62/740,163, filed on Oct. 2, 2018.

(51) Int. Cl.
*H01B 12/02* (2006.01)
*C01G 3/00* (2006.01)
*G21B 1/05* (2006.01)

(52) U.S. Cl.
CPC ............ *G21B 1/057* (2013.01); *C01G 3/006* (2013.01); *H01B 12/02* (2013.01); *C01P 2002/52* (2013.01); *C01P 2006/40* (2013.01)

(58) Field of Classification Search
CPC ................................. H01B 1/08; H01L 39/249
(Continued)

(56) References Cited

U.S. PATENT DOCUMENTS 4,996,192 A * 2/1991 Fleischer .............. H01L 39/126
505/320
5,087,606 A * 2/1992 Fleischer .............. H01L 39/126
505/121
(Continued)

FOREIGN PATENT DOCUMENTS

JP      H06-140675       3/1992
WO   WO 2020/142119 A2   7/2020
WO   WO 2020/142119 A3   8/2020

OTHER PUBLICATIONS

Mitamura et al "Flux-line pinning in polycrystalline La1.85Sr0.15CuO4 irradiated with swift heavy ions", IEEE 1999 (0-7803-4538-X/99/$10.00).*
(Continued)

*Primary Examiner* — Mark Kopec
(74) *Attorney, Agent, or Firm* — DALY, CROWLEY, MOFFORD & DURKEE LLP

(57) ABSTRACT

Disclosed are a superconductor having improved critical current density when exposed to high-energy neutron radiation and high magnetic fields, such as found in a compact nuclear fusion reactor, and a method of making the same. The method includes, prior to deployment in the exposure environment, irradiating a polycrystalline (e.g. cuprate) superconductor with ionic matter or neutrons at a cryogenic temperature to create "weak" magnetic flux pinning sites, such as point defects or small defect clusters. Irradiation temperature is chosen, for example as a function of the superconducting material, so that irradiation creates the beneficial flux pinning sites while avoiding detrimental widening of the boundaries of the crystalline grains caused by diffusion of the displaced atoms. Such a superconductor in a coated-conductor tape is expected to be beneficial when used, for example, as a toroidal field coil in a fusion reactor when cooled well below its critical temperature.

18 Claims, 26 Drawing Sheets

(58) Field of Classification Search
USPC .................................................. 505/320, 325
See application file for complete search history.

(56) References Cited

U.S. PATENT DOCUMENTS

| | | | |
|---|---|---|---|
| 5,096,882 | A | 3/1992 | Kato et al. |
| 5,912,210 | A * | 6/1999 | Krusin-Elbaum .... H01L 39/249 |
| | | | 505/480 |
| 6,525,002 | B1 | 2/2003 | Weinstein |
| 7,491,678 | B2 * | 2/2009 | Crisan ................. H01L 39/2483 |
| | | | 505/238 |
| 2003/0207765 | A1 | 11/2003 | Bower et al. |
| 2015/0263259 | A1 | 9/2015 | Welp et al. |
| 2018/0047461 | A1 | 2/2018 | Cohen et al. |
| 2022/0005614 | A1 | 1/2022 | Sorbom et al. |

OTHER PUBLICATIONS

Wang et al "Irradiation-induced nanostructures", Materials Science and Engineering A286 (2000) 72-80.*
Albiss et al "Effect of gamma-irradiation on polycrystalline Tl1Ba2Ca2Cu3Oy superconductor", Physica B 321 (2002) 324-327.*
Newcomer et al. "Temperature dependent microstructural modification in ion-irradiated Tl-type high temperature superconductors", Physica C 267 (1996) 243-253.*
Mihalache etal "The influence of neutron irradiation on (B0.65C0.35)Ba1.4Sr0.6Ca2Cu3Oz superconducting phase: the role of grain edge", Journal of Superconductivity: Incorporating Novel Magnetism, vol. 18, No. 4, Aug. 2005.*
Sen et al. "Study of grain boundary characteristics of proton irradiated textured polycrystalline Bi2Sr2CaCu2O8+x and Bi1.84Pb0.34Sr1.91Ca2.03Cu3.06O10+x superconductors", Solid State Comm 129 (2001) 201-204.*
Perkins, et al.; "Effects of proton irradiation and ageing on the superconducting properties of single crystalline and polycrystalline MgB2"; Superconductor Science and Technology; vol. 17; No. 1; Dec. 9, 2003; 18 Pgaes.
Search Report of the ISA dated Jul. 23, 2020 for International Application No. PCT/US2019/054211; 6 Pages.
Written Opinion of the ISA dated Jul. 23, 2020 for International Application No. PCT/US2019/054211; 6 Pages.
U.S. Appl. No. 17/281,828, filed Mar. 31, 2021, Sorbom et al.
European Communication Pursuant to Rule 161(2) and 162 EPC dated May 20, 2021 for European Application No. 19906952.7; 3 Pages.
Antonova et al. "Effect of 2.5 MeV proton irradiation on the critical parameters of composite HTS tapes", Phys. Status Solidi C 12, No. 1-2; Oct. 31, 2014, 4 pages.
Eisterer et al. "Neutron irradiation of coated conductors" Superconductor Science Technology 23 (2010) 014009, 6 pages.
Frischherz et al. "Defects cascade produced by neutron irradiation in $YBa_2Cu_3O_{7-\sigma}$", Physica C, Jul. 7, 1994, 19 pages.
Frischherz et al. "The Defect Structure of Ion and Neutron Irradiated $Yba_2cu_3o_{7-\sigma}$Single Crystals*", ATSM Symposium, Effects of Radiation on Materials, Jun. 17-21, 1990, 16 pages.
Greene et al. "The Effect of Proton Irradiation on the Critical Current of Commercially Produced YBCO Conductors" IEEE Transactions on Applied Superconductivity, vol. 19, No. 3, Jun. 2009, 4 pages.
Kirk "Irradiation Defect Structures in $YBa2Cu3O7_{-x}$ And Their Correlation with Superconducting Properties" Nov. 26, 1990, 11 pages.
Kirk "Structure and flux pinning properties of irradiation defects in $YBa_2Cu_3O_{7-x}$*", Critical Currents in High $T_c$ Superconductors, Apr. 22-24, 1992, 8 pages.
Kupfer et al. "Influence of Fast Neutron Irradiation on Inter- and Intragrain Properties of Ceramic YBa2Cu3O7", IEEE Transactions on Magnetics, vol. 25, No. 2, Mar. 1989, 4 pages.

Leonard et al. "Irradiation performance of rare earth and nanoparticle enhanced high temperature superconducting films based on YBCO" Nuclear Materials and Energy, Apr. 6, 2016, 5 pages.
Okada et al. "Effects of neutron irradiation on superconducting properties of orthorhombic Y—Ba—Cu oxides" Radiation Effects and Defects in Solids, Jun. 30, 2017, 9 pages.
Petrov et al. "Superconductivity Degradation In Gd-Containing High Temperature Superconductors (HTSC) Under Thermal Neutron Irradiation", Latvian Academy of Sciences, Mar. 1, 1999, 27 pages.
Prokopec et al. "Suitability of coated conductors for fusion magnets in view of their radiation response" Semiconductors Science Technology 28, Dec. 9, 2014, 6 pages.
Sauerzopf et al. "Fast neutron irradiation and flux pinning in single crystalline high temperature superconductors", Cryogenics, vol. 33, No. 1, 1993, 6 pages.
Weber "Radiation Effects on Superconducting Fusion Magnet Components" International Journal of Modern Physics E, vol. 20, No. 6, Jan. 31, 2011, 55 pages.
Zhang et al. "Effects of Neutron Irradiation on Superconducting Properties of $GdBa_2Cu_3O_{7-\sigma}$Single Domain Superconductor", Chinese Journal of Chemical Physics, vol. 20, No. 3, Jun. 27, 2007, 5 pages.
Response to European Communication Pursuant to Rule 161(2) and 162 EPC (with Amended Claims) dated May 20, 2021 for European Application No. 19906952.7; Response filed Nov. 16, 2021; 5 Pages.
PCT International Preliminary Report on Patentability dated Apr. 15, 2021 for International Application No. PCT/US2019/054211; 7 Pages.
Sorbom et al.; "ARC: A compact, high-field, fusion nuclear science facility and demonstration power plant with demountable magnets"; Fusion Engineering and Design; Aug. 18, 2015; 35 Pages.
Was; "Challenges to the use of ion irradiation for emulating reactor irradiation"; Focus Issue: Characterization and Modeling of Radiation Damage on Materials: State of the Art, Challenges, and Protocols; vol. 30, Issue 9; May 14, 2015; 14 Pages.
Michael et al.; "Development of REBCO-Based Magnets for Plasma Physics Research"; IEEE Transactions on Applied Superconductivity; vol. 24, Issue 4; Nov. 9, 2016; 3 Pages.
Frischherz et al.; "Defect cascades produced by neutron irradiation in YBa2Cu3O7-δ"; Physica C 232; 1994; 19 Pages.
Okada et al.; "Effects of neutron irradiation on superconducting properties of orthorhombic Y—Ba—Cu oxides"; Radiation Effects and Defects in Solids: Incorporating Plasma Science and Plasma Technology; 108:2-4; Aug. 19, 2006; 9 Pages.
Fuger et al.; "Influence of neutron irradiation on high temperature superconducting coated conductors"; Physica C 468; 2008; 5 pages.
Eisterer et al.; "Neutron irradiation of coated conductors"; Superconductor Science and Technology 23.1; 2009; 15 Pages.
Antonova et al.; "Effect of 2.5 MeV proton irradiation on the critical parameters of composite HTS tapes"; Physica Stastus Solidi C; vol. 12, No. 1-2; Published online Oct. 30, 2014; 4 Pages.
Prokopec et al.; "Suitability of coated conductors for fusion magnets in view of their radiation response"; IOP Publishing; Superconductor Science and Technology; vol. 28; 2015; Dec. 9, 2014; 7 Pages.
European Communication Pursuant to Rules 70(2) and 70a(2) EPC for European Application No. 19906952.7 dated Jul. 26, 2022; 1 Page.
European Partial Search Report with Amended Claims for European Application No. 19906952.7 dated May 13, 2022; 16 Pages.
Menard et al.; "Fusion nuclear science facilities and pilot plants based on the spherical tokamak"; IOP Publishing; International Atomic Energy Agency; Nucl. Fusion vol. 56; 2016; 43 Pages.
Hayashi et al.; "Neutronics assessment of advanced shield materials using metal hydride and borohydride for fusion reactors"; Fusion Engineering and Design 81; 2006; 6 Pages.
Chuyanov et al.; "Modular fusion power plant"; Fusion Engineering and Design 122; 2017; 15 Pages.
European Partial Search Report with Amended Claims for European Application No. 19906952.7 dated Jul. 7, 2022; 21 Pages.

(56) References Cited

OTHER PUBLICATIONS

Nishimura et al.; "14 Mev Neutron Irradiation Effect on Critical Current and Critical Magnetic Field of NB3SN and NB3AL Wires"; AIP Conference Proceedings 1219, 255; 2010; Apr. 7, 2010; 10 Pages.

Bourgault et al.; "Modifications of the physical properties of the high-Tc superconductors YBa2Cy2O7-δ (0.<δ<0.7) by 3.5-GeV xenon ion bombardment"; Physical Review B; vol. 39, No. 10; Apr. 1, 1989; 6 Pages.

Behera et al.; "Irradiation-Induced Inter-And Intra-Granular Modifications By 120 MeV Ions In YBa2Cu1O7 Thick Films"; Modern Physics Letter B.; vol. 15, No. 2; 2001; 12 Pages.

Ando et al.; "Design of the TF Coil for a Tokamak Fusion Power Reactor with YBCO Tape Superconductors"; 21$^{st}$ IEEE/NPS Symposium on Fusion Engineering SOFE 05; 2005; 4 Pages.

Yoshida et al.; "Low-Temperature Neutron Irradiation Tests of Superconducting Magnet Materials Using Reactor Neutrons At Kur"; AIP Conference Proceeding; Advances in Cryogenic Engineering; vol. 1435; 2012; 7 Pages.

European Response to 70a(2) Rule dated Jul. 26, 2022; Response filed Feb. 2, 2023 for European Application No. EP19906952.7; 7 Pages.

Office Action dated May 23, 2023 for Japanese Application No. 2021-518071; 15 Pages.

Behera et al.; "Irradiation-Induced Inter- And Intra-Granular Modifications by 120 MeV S Ions In YBa2Cu3O7 Thick Films"; Modern Physics Letters B, vol. 15, No. 2, Jan. 2001; 12 Pages.

Shimomura et al.; "Neutron irradiation Effect and Radiation Damage on High-To Superconductors"; Collaborative Research Technical Report; Summary Report of Activities under Visiting Research Program; 1989; 3 Pages.

\* cited by examiner

◯ Y/ba  ● Cu/O  ○ reconstructed Cu/O

CRYOGENIC RADIATION ENHANCEMENT OF SUPERCONDUCTORS

CROSS REFERENCE TO RELATED APPLICATION

This application claims the benefit of U.S. Provisional Application 62/740,163, filed Oct. 2, 2018 and having the same title and inventorship, the contents of which are incorporated by reference as if fully set forth herein.

STATEMENT REGARDING FEDERALLY SPONSORED RESEARCH

This invention was made with Government support under Grant Number NRC-HQ-13-G-38-0045 awarded by The U.S. Nuclear Regulatory Commission (NRC). The Government has certain rights in the invention.

FIELD

The disclosure pertains generally to superconducting materials, and more particularly to techniques for enhancing the critical current density in superconducting materials when used in an environment having high magnetic fields and high-energy neutron radiation.

BACKGROUND

Rare-earth barium copper oxide ("REBCO") is a ceramic-based high-temperature superconductor ("HTS"). An illustrative crystal structure for REBCO is shown in FIG. 1. Although ceramic-based HTS was first discovered in 1987, large scale production of REBCO HTS conductors was not possible until recently due to the difficulty in manufacturing long strands of REBCO that still retain high performance. Advances in deposition precursor methods such as rolling-assisted, biaxial-textured substrates ("RABiTS") and ion beam-assisted deposition ("IBAD") have allowed the production of kilometer-length strands of REBCO in the past few years, opening up the possibility of using HTS to wind large bore magnets for use in fusion devices, among other applications.

Previously, the maximum on-coil magnetic field strength in a superconducting tokamak fusion device was limited to approximately 13 Tesla (13 T), constraining the on-axis field strength to about 6 T for a standard aspect ratio. However, the expanded operational space in field, current, and temperature of REBCO removes this constraint. The lack of significant critical current degradation of REBCO at high magnetic fields allows tokamaks to be designed with much higher on-axis fields. Access to higher fields significantly relaxes plasma physics constraints and allows smaller devices at higher fields to access the same performance as larger devices with lower fields.

Superconducting magnets of all types, both low-temperature superconductors ("LTS") and HTS, have been shown to be sensitive to high-energy neutron radiation. However, all fusion-relevant HTS irradiation studies to date have been predicated on the existence of a large (i.e. major radius R>6 m) reactor which has ample shielding in the radial build. Another important difference between HTS magnets and LTS magnets is that LTS magnets require a large amount of electrical insulation which is typically more sensitive to radiation than the superconductor itself. These two factors have driven fusion irradiation studies of HTS (specifically REBCO) for fusion applications in the past two decades.

Due to the high cost and difficulty of handling radioactive samples from fission reactor irradiations, neutron irradiation studies to date understandably have investigated the effects of radiation damage only up to a certain amount which is "good enough" to qualify coated conductors for use in a large fusion reactor, measured as a fluence of irradiated particles per unit area. This fluence is generally understood to be approximately $3\times10^{18}$ neutrons/cm$^2$ of "fast" neutrons with energy>0.1 million electron-volts (0.1 MeV). For example, in a large fusion reactor, such as the ITER tokamak, lifetime fluence to its coils is only expected to be about $2\times10^{18}$ neutrons/cm$^2$.

In compact, high-field reactors utilizing HTS, however, this situation changes significantly. As high-field magnets allow small, high-performance devices to be designed, the thickness of magnet neutron shielding, particularly in the inboard leg, drops along with the size of the device. This is an inescapable issue since neutrons are the primary energy source in deuterium-tritium ("D-T") fusion, but their trajectories are unaffected by the higher magnetic field because they carry no charge. As neutron attenuation is an exponential, as opposed to linear effect, linear reductions in shield thickness lead to exponentially higher neutron fluxes reaching the magnet. In addition, the possibility of designing non-insulated HTS fusion magnets makes the primary radiation-limited material in such a magnet be the superconductor, rather than the electrical insulation. Finally, in order to attain the high performance required for high-field magnets, the HTS in a compact device may be "sub-cooled" far below its critical temperature, for example to temperatures between 10-20K. These new conditions motivate an expansion of REBCO irradiation research to higher fluences, with measurements performed at the low temperatures and high fields which will be present in a compact, high-field design.

While previous REBCO irradiation studies can be used to guide compact reactor design, the wide variety of REBCO tape production methods motivates large-scale irradiation studies to compare radiation effects on different tape compositions under compact reactor-relevant operating conditions such as cryogenic irradiation temperature. Although such studies were performed on Nb$_3$Sn, no facilities currently exist that can perform cryogenic neutron irradiations. Before such facilities were phased out in the 1990's, a small number of cryogenic YBCO neutron irradiations were performed. While these studies showed differences between cryogenic and room temperature irradiations, there is no data at the higher fluences and low temperature/high-field conditions relevant to compact HTS fusion reactors. In addition, the irradiated YBCO samples of these prior art studies were either single-crystal or sintered polycrystalline samples from the early days of HTS development, as opposed to the long-length, high quality, grain-aligned, coated-conductor superconductors available today, and are therefore of limited use. FIG. 2 shows a cross-section of the layers of an illustrative modern, coated-conductor REBCO tape.

In the context of superconductor performance for fusion magnets, the figure of merit for assessing "damage" or "enhancement" to the superconductor is the critical current Ic. Although Ic is the directly measurable quantity, the microscopic physics performance parameter is really the critical current density Jc through the cross section of the superconductor itself (neglecting the addition of mechanical and stabilizing layers present in commercial tapes). The quantity Jc can be determined by dividing the measured Ic by the width of the coated conductor and the thickness of the REBCO layer, for example as determined by tunneling electron microscope ("TEM") measurements, and is used as the primary tape performance metric throughout the rest of this disclosure.

As REBCO is irradiated, a wide variety of changes occur within the ordered superconducting crystal lattice, and competing effects on Jc emerge. On one hand, the displacements of atoms and creation of defect clusters has the tendency to lower Jc through (a) suppression of the superconducting critical temperature Tc, (b) lattice amorphization, (c) degradation of intergrain current transfer, and (d) the disordering of intrinsic pinning sites. On the other hand, point defects and defect clusters can act as artificial pinning centers, increasing Jc by the creation of beneficial pinning sites. The cumulative effect of these mechanisms can be observed as a net increase or decrease of measured Jc. A summary of these known mechanisms is presented here.

Suppression of Critical Temperature

The first mechanism of Jc degradation in irradiated superconductors comes through suppression of the critical temperature Tc by means of the accumulation of radiation-induced defects. Near Tc, the dependence of Jc on temperature can be given by Ginzburg-Landau ("GL") theory as:

$$J_c = J_0\left(1 - \frac{T}{T_c}\right)^{(3/2)} \quad (1)$$

Thus, a degradation of Tc will lead to a reduction of the critical current Jc. The chemical reason for Tc degradation in YBCO superconductors is related to the oxygen deficiency $\delta$ of $YB_2Cu_3O_{7-\delta}$, which is a measure of the "doped hole concentration" p, defined as the concentration of holes per Cu atom in the $CuO_2$ planes. Tc varies parabolically with hole concentration, with an optimum hole concentration of p≈0.16 as seen in FIG. 3.

The explanation for the effect of hole concentration on Tc has been theorized to be enhanced electron scattering due to the added magnetic and non-magnetic impurities leading to "de-pairing" of the Cooper pairs carrying the supercurrent. This scattering occurs in the superconducting $CuO_2$ planes as more Cu and O vacancies are introduced. In a systematic study of defects introduced through electron irradiation, it was found that Cu vacancies are approximately twice as effective as O vacancies at pair breaking, and that irradiation-induced Tc degradation for the electron irradiations was insensitive to radiation temperature below 300 K, although it should be noted that the study did not investigate the effects of higher-temperature irradiation up to about 400 K which has been the case in more recent accelerator and fission reactor irradiations.

The other microstructural explanation for pair breaking is related to the structure of the cuprate lattice. As mentioned above, the oxygen stoichiometry of cuprate superconductors has a large influence on the lattice parameters and structure of the superconducting crystal. At a $\delta$ value of approximately 0.6, a phase transition from tetragonal to orthorhombic occurs in the crystal lattice of the cuprate. This observation led to the development of a "charge reservoir/transfer" model where Cu—O chains act as reservoirs for charge at the $CuO_2$ superconducting planes. The disorder of the Cu—O chains effects the number of electron holes (i.e. charge carriers) available to the $CuO_2$ planes. It is important to note that radiation damage leading to Tc degradation is distinctly different from full amorphization of the superconducting lattice, as the $CuO_2$ planes damaged as described above can still carry supercurrent. From a microstructural point of view, the type of damage leading to Tc degradation is defects or small clusters of point defects.

Lattice Amorphization

The second general type of radiation damage that can occur in superconductors is full amorphization of the superconducting lattice, leading to normal (i.e., non-superconducting) regions within the superconductor. The filamentary model of Moeckly et al. describes a high temperature superconductor as "a composite system consisting of a network of superconductive filaments embedded in a non-superconductive matrix", with the size of the filaments being on the order of the superconducting coherence length, $\xi$. As defect clusters and cascades are introduced into the superconducting material, the network of superconducting filaments becomes less and less dense until the superconducting state collapses completely.

Early experiments by Kirk and Frisccherz observed (through TEM measurements) the formation of an intragranular "cellular" microstructure of superconducting cells with a diameter of about 5-10 nm surrounded by highly amorphous regions in irradiated YBCO crystals. The onset of this microstructure corresponded to a rapid degradation of Tc (and thus Jc) suggesting the complete blockage of supercurrent by these cellular boundaries. An interesting observation of these studies was that the onset of the cellular structure was highly dependent on both the original superconductor quality (defined as the sharpness of transition between superconducting and normal state) and the type of irradiation. Cellular onset was observed at a calculated displacements-per-atom ("DPA") of 0.07 for ion irradiations but only 0.003 for neutron irradiations, suggesting that this structure was only created by the large cascades produced by the high-energy recoils characteristic of neutron irradiation. Later experiments with higher quality YBCO crystals did not observe the onset of cellular microstructure for fluences up to $8\times10^{17}$ n/cm$^2$ and hypothesized that it would require fluences on the order of about $5\text{-}10\times10^{18}$ n/cm$^2$ to observe the onset of the cellular microstructure, based on high-fluence ion irradiations of the improved YBCO crystals.

Grain Boundary Disorder

For modern coated conductors such as commercial REBCO tapes, it is important to make the distinction between critical current within grains and between grains. Grain boundary misorientations of even a few degrees lead to bulk degradation of the sample Jc of factors of 10 to 50, and the application of magnetic fields only increase this deleterious effect. The microstructural mechanisms between lattice (intragrain) and grain boundary (intergrain) current degradation are similar and related to weak coupling between the superconducting filaments.

Weak coupling arises due to the "Josephson effect", a macroscopic manifestation of the quantum mechanical nature of superconductors. The Josephson effect is the property of supercurrent to flow through a thin (about 1 nm) insulating layer (referred to as a "Josephson junction") due to quantum tunneling, and has been extensively studied since the 1960s, particularly in the application to Superconducting QUantum Interference Devices ("SQUIDs"). Within the filamentary model of HTS superconductors, filaments can be connected by these weak links, allowing the so-called "glassy" superconducting phase to occur within a single grain. Early experiments showed evidence for two distinct contributions to critical current density, a "weak link coupling"-dominated contribution and a pinning contribution, the former contribution being dominant at low fields and the latter contribution being dominant at high fields. While intragrain weak coupling was shown to exist at extremely low fields, the more relevant weak coupling regime for fusion applications exists for intergrain (grain boundary) coupling, which can exist up to fields of several Tesla in unirradiated superconductors.

Typical grain boundaries in modern coated conductors are on the order of a nanometer. For example, FIG. 4 shows a TEM image of an illustrative YBCO superconductor having a 30 degree [001] tilt grain boundary whose structure units have been highlighted to show the approximate width (about 1 nm) of the grain boundary. As a bulk HTS coated conductor is irradiated, its grain boundaries will act as sinks to defects and widen, becoming progressively stronger barriers to transport current as the grain exceeds the coherence length. Current transport through a grain boundary can be calculated as $Jc=J_0 \exp(-2\kappa\Delta)$, where Jc is the tunneling current density through the boundary, $J_0$ is the current density at the boundary, κ is the decay constant, for example 7.7 nm$^{-1}$, and Δ is the width of the boundary interface. Thus, as the HTS is irradiated, weak link coupling due to grain boundary widening will become the dominant effect limiting critical current density at higher and higher fields as Jc drops below the pinning-limited Jc. Recent work on neutron-irradiated superconductors has shown that the crossover in transport Jc vs. B curves for irradiated and unirradiated coated conductors can be used to approximately determine the field at which critical current changes from a grain-boundary-limited regime to a flux-pinning-limited regime.

Flux Pinning

The final way that irradiation can influence superconductor properties is through flux pinning effects. The property of Type II superconductors allowing lines of magnetic flux to penetrate the superconductor has important implications to the critical current. As current is passed through the superconductor, the flux lines in the normal cores will experience a Lorentz force:

$$\vec{F}_L = q\vec{v} \times \vec{B} \tag{2}$$

This force will cause the flux lines to move and will only be counteracted by a "pinning" force exerted by defects in the superconducting material which hold the flux lines in place, as shown in FIG. 5 for different types of defect configurations described below.

The mechanism responsible for the pinning force is the same thermodynamic mechanism responsible for flux inclusion of Type II superconductors described above, for which free energy density plots are shown in FIG. 5A. In a Type II superconductor, it is energetically favorable for flux lines from an applied magnetic field (above the first critical field) to penetrate some of the superconducting regions, transforming the pure superconductor into a mixed state of superconducting and normal regions. In this way, the system reaches equilibrium when a certain amount of flux has penetrated the superconductor. However, if normal or partially normal regions already exist due to the presence of defects, the free energy density of a flux vortex is reduced when it is at a pinning site, creating a potential well for the flux line.

The existence of more pinning sites increases the total pinning force, and thus the critical current value. Pinning sites can be classified into many different categories, summarized below.

The first pinning classification is simply whether the pinning sites are intrinsic to the ideal superconducting lattice or whether they are extrinsic, or artificially produced. In REBCO, the large asymmetry between current-carrying capacity depending on field orientation arises from the fact that the Cu—O chain layers act as 2D intrinsic pinning centers to magnetic flux lines parallel to the ab plane of the tape.

The second pinning classification deals with the length over which the pinning force operates. Referring to FIG. 5A, the two most important length scales relating to flux vortices are the penetration depth (λ) and aforementioned coherence length (ξ) where λ is the length scale for the screening current vortices and ξ is the length scale for the normal cores. For YBCO, since λ is approximately 100 times the value of ξ, it is more effective to introduce pins on the order of ξ (about 1 to 4 nm) to maximize the pinning density, so manufacturers often introduce artificial sites, such as BZO nanorods or $RE_2O_3$ precipitates, on the order of a few nm to increase performance. In the context of radiation damage, many of the observed defect clusters created in REBCO by neutron irradiation are on the order of several nanometers, comparable to ξ.

The third classification is the strength of the pins. Strong pinning sites distort the flux line lattice itself and are generally very stable against thermal motion due to the vibration of lattice atoms at high temperatures. Weak pinning sites act collectively, and the shape of the flux line lattice is preserved. An example of a strong pinning site would be a BZO nanorod or $RE_2O_3$ precipitate. Weak pinning sites are smaller in size, such as point defects or small defect clusters. To illustrate the difference, FIG. 5 shows a superconducting material 10 that includes a strong pinning site 12 that deforms the flux lines of the magnetic field and a weak pinning site 14 that does not.

The volumetric pinning force associated with strong pins can be expressed as:

$$F_{p,s} = n_{a,f} f_{p,l} \tag{3}$$

where $n_{a,f}$ represents the areal flux vortex density and $f_{p,l}$ is the pinning force per unit length along the pinned flux line. The weak pinning force density can be expressed as:

$$F_{p,w} = \left(\frac{n_{v,w} f_{p,0}^2}{V_c}\right)^{1/2} \tag{4}$$

where $n_{v,w}$ is the volume density of weak pins, $f_{p,0}$ is the force per weak pin, and $V_c$ is the volume of weak pins acting to pin a single flux line.

It is important to note that the nomenclature "strong" and "weak" refers to the strength of the pinning sites relative to the thermal fluctuations in the lattice, not necessarily to their effectiveness at pinning stronger or weaker applied fields. In fact, due to their collective nature, "weak" pinning sites are often dominant at high field conditions because thermal motion is naturally suppressed at cryogenic temperatures.

The fourth classification is the directionality of the pinning site. Random pinning centers have no particular direction and increase Jc at all applied field angles. However, correlated pinning sites act primarily to pin flux lines in one orientation. For example, BZO nanorods introduced parallel to the c-axis of the superconductor will effectively pin fields applied parallel to the c-axis, but their pinning effectiveness vanishes at other angles. This effect is diminished at lower temperatures and high fields but underscores the importance of obtaining angularly-resolved Jc measurements for the purposes of designing fusion magnets where twisted cable configurations typically used to prevent AC losses and the minimum Jc is limiting.

The fifth and final pin classification is the dimensionality of the pinning site. Point defects are considered 0D pinning sites, and all larger pinning sites can be classified as being 1D, 2D, or 3D. Examples of the larger pinning sites would be BZO columns as 1D defects, Cu—O chain layers as 2D defects, and $RE_2O_3$ precipitates as 3D defects.

SUMMARY OF DISCLOSED EMBODIMENTS

Results for the Jc changes of proton-irradiated REBCO tapes at different fluences and irradiation temperatures are presented below. In brief, ion irradiation at cryogenic temperatures was found to substantially reduce the amount of Jc degradation in the REBCO samples irradiated to high fluences, a result of great importance to superconducting REBCO magnets in fusion applications where the radiation will occur at $T \leq 80$ K. An analysis of temperature, field, and angle dependencies of Jc suggests that the microstructural mechanism behind the differences of Jc with irradiation temperature for a given fluence is two-fold.

The larger effect that degrades Jc is that higher-temperature irradiations cause significantly more grain boundary damage, evidenced by the large measured decrease in Jc over all fields for the high temperature irradiations. This effect can be explained by a much larger oxygen diffusion coefficient at high temperatures (modeled through molecular dynamics simulations), leading to the enhanced migration of defects to grain boundary sinks during irradiation. Molecular dynamics simulations suggest that the same mechanism (i.e. enhanced grain boundary disorder) behind the experimentally observed importance of sample temperature control for ion (e.g. proton) irradiations also applies to neutron irradiations.

The smaller effect is that the creation of effective weak, uncorrelated pinning sites appears to be slightly enhanced at the lower temperature irradiations, opposing Jc degradation. This effect is most likely caused by the decreased defect mobility at low irradiation temperatures, leading to the preferential creation of point defects or small defect clusters which act as more effective weak pinning sites. The practical result of this effect is that REBCO performance at high fields is increased, partially canceling out the detrimental effects due to lattice disorder from the irradiation.

Therefore, a first embodiment of these findings is a method comprising irradiating a polycrystalline superconductor with protons, larger ions, or neutrons at a cryogenic temperature chosen to effectively eliminate widening, of boundaries of the crystalline grains of the superconductor, caused by diffusion of radiatively displaced atoms. A second, related embodiment is the composition of matter formed by this process.

In some embodiments of either the method or the composition of matter, the superconductor comprises a rare-earth copper oxide superconductor, including but not limited to a REBCO compound. In some embodiments, the cryogenic temperature is at most 80 K, attainable by liquid nitrogen cooling. In some embodiments, irradiating comprises choosing an ion or neutron fluence that maximizes a critical current density in the irradiated superconductor when operating in a condition in which weak magnetic flux pinning dominates strong magnetic flux pinning. In some embodiments, irradiating comprises producing at least 0.003 displacements per atom (DPA). In some embodiments, irradiating forms at least one weak pinning site within the superconductor.

Some application-specific embodiments include providing the irradiated superconductor as a tape. The tape may be coated with at least one electrical conductor. This coated-conductor tape may be used, for example, in an affordable, robust, and compact (ARC) nuclear fusion reactor, and in particular may be wound around a chamber for fusing nuclei of a plasma. Operation of the reactor may include cryogenically cooling the tape and passing an electrical current through it, thereby generating a magnetic field suitable for confining the plasma in the chamber. In some embodiments, cryogenically cooling the wound tape includes "sub-cooling" the tape to a temperature of approximately 20 K-well below the irradiation temperature and the superconducting critical temperature.

In this connection, a third embodiment is a nuclear fusion reactor having at least one toroidal field coil that comprises a polycrystalline superconductor that was irradiated with ions or neutrons at a cryogenic temperature chosen to effectively eliminate widening, of boundaries of the crystalline grains of the superconductor, caused by diffusion of radiatively displaced atoms.

Persons having ordinary skill in the art may appreciate other embodiments of the concepts, results, and techniques disclosed herein. It is appreciated that superconductors irradiated according to the concepts and techniques described herein may be useful for a wide variety of applications.

One such application is conducting nuclear magnetic resonance (NMR) research into, for example, solid state physics, physiology, or proteins, for which such superconductors may provide a higher magnetic field (10 T to 25 T) and simpler design than existing systems.

Another application is performing clinical magnetic resonance imaging (MRI) for medical scanning of an organism or a portion thereof, for which compact, high-field superconductors are needed without expensive cryogens (such as liquid helium) or extensive maintenance. Yet another application is high-field MRI, for which large bore solenoids are required.

Still another application is for performing magnetic research in physics, chemistry, and materials science.

A further application is in compact particle accelerators for materials processing or interrogation, where such superconductors as small dipole magnets provide compactness, a high field, stability, and transportability.

Another application is in electrical power generators, including wind turbines, as disclosed embodiments are compact, lightweight, and withstand higher temperatures and high magnetic fields.

Another application is medical accelerators for, among other things, proton therapy, radiation therapy, and radiation generation generally.

Yet another application is in superconducting energy storage, for which disclosed embodiments provide higher temperatures, higher fields, greater stability, and simpler storage device designs.

Another application is in magnetohydrodynamic (MHD) electrical generators, in which the higher magnetic field translates to a higher power production efficiency.

Another application is in material separation, such as mining, semiconductor fabrication, and recycling, as disclosed small-bore dipole embodiments are robust and tolerate a higher current density and temperature than existing systems.

It is appreciated that the above list of applications is not exhaustive, and there are further applications to which the concepts, processes, and techniques disclosed herein may be put without deviating from their scope.

DESCRIPTION OF THE SEVERAL VIEWS OF THE DRAWINGS

The manner and process of making and using the disclosed embodiments may be appreciated by reference to the drawings, in which.

DETAILED DESCRIPTION

In this specification, including the appended claims, the following quoted terms shall have the indicated meanings that are not limited to specific embodiments, except where expressly indicated otherwise:

"HTS" stands for "high-temperature superconductor" and means any material whose superconducting critical temperature Tc is greater than about 30 K.

"LTS" stands for "low-temperature superconductor" and means any material whose superconducting critical temperature Tc is less than about 30 K.

"REBCO" is an acronym for "rare-earth barium copper oxide" as known in the art. However, as used in accordance with embodiments herein, "REBCO" specifically means any rare-earth cuprate HTS; unless expressly stated otherwise, barium may be present, but is not required to be present.

"TEM" stands for "tunneling electron microscope" as known in the art.

"DPA" stands for "displacements per atom" and equals the ratio of the number of atoms in a crystal lattice displaced by incident radiation to the total number of atoms in the lattice.

"BZO" stands for "barium zirconium oxide" compounds as known in the art, especially the compound with chemical formula BaZrO$_3$.

Main Result

Using 1.2 MeV protons provided by the DANTE accelerator at the Massachusetts Institute of Technology ("MIT"), REBCO samples were irradiated to four different fluences ($1\times10^{15}$ p/cm$^2$, $5\times10^{15}$ p/cm$^2$, $1\times10^{16}$ p/cm$^2$, and $5\times10^{16}$ p/cm$^2$) at three different irradiation temperatures (80 K, 323 K, and 423 K). The highest fluence value was chosen to approximately match the displacements-per-atom ("DPA") of 0.003 at which previous studies observed Jc degradation due to neutron irradiation. The Robinson Research Institute ("RRI") SuperCurrent system was subsequently used to analyze critical current Ic in the irradiated samples, from which Jc was calculated.

Figure 6:
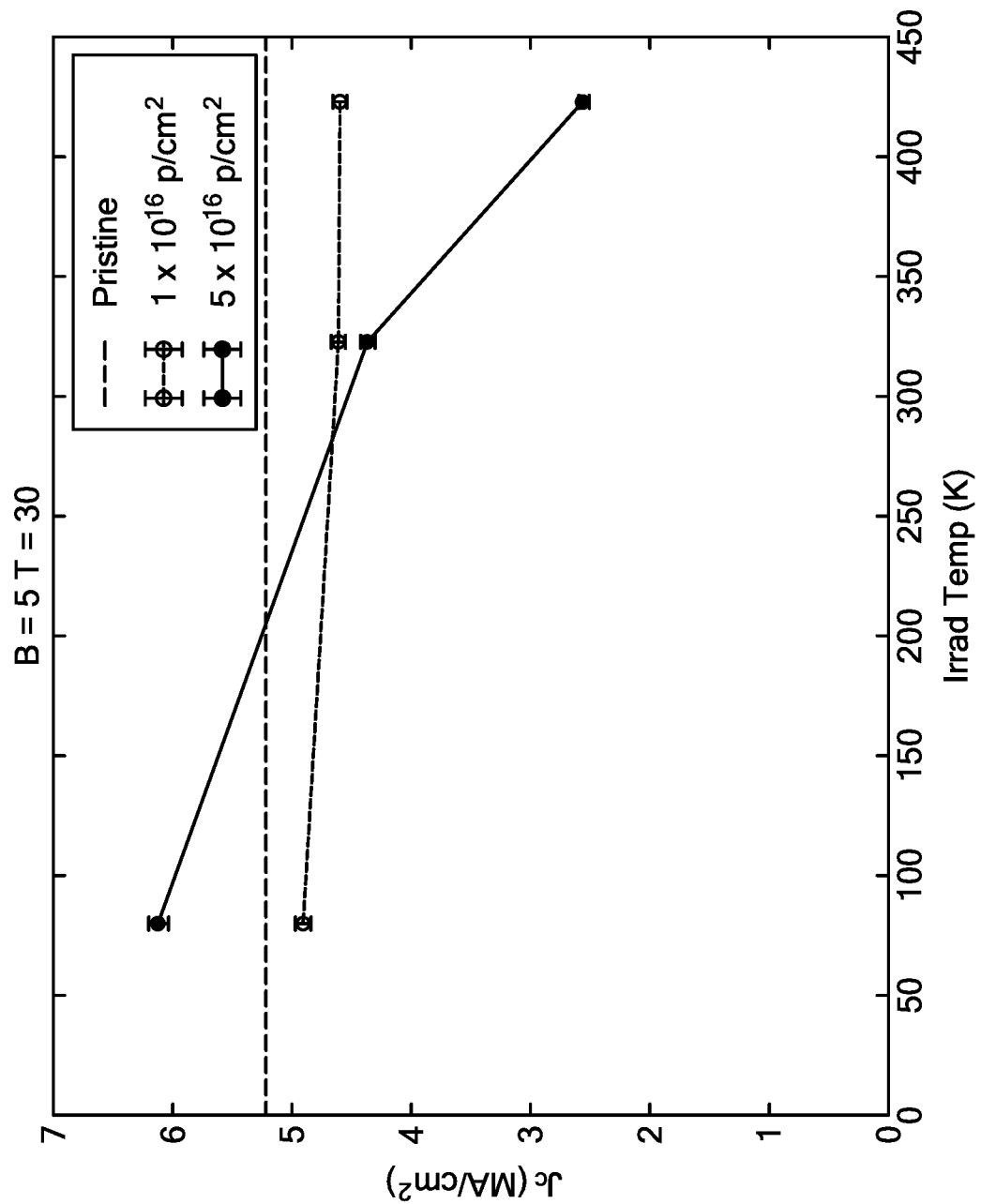
FIG. 6 is a plot of critical current density Jc, at 5 T and 30 K, of samples irradiated at different temperatures to fluences of $1\times10^{16}$ p/cm$^2$ and $5\times10^{16}$ p/cm$^2$.

The main discovery underlying the concepts, techniques, and structures present in disclosed embodiments is that irradiation temperature unequivocally plays a role in the Jc degradation induced during irradiation, and in the subsequent impact on Jc. This effect can be seen in FIG. 6, displaying the critical current density of samples irradiated at different temperatures to fluences of $1\times10^{16}$ p/cm$^2$ and $5\times10^{16}$ p/cm$^2$. At measurement conditions relevant to a compact, high-field fusion reactor (for example, magnetic field strength 5 T and temperature 30 K), the irradiation temperature is shown to degrade the minimum Jc by approximately a factor of 2 between the 80 K and 423 K irradiation at the higher fluence. This result has significant implications for fusion magnets, as all previous REBCO irradiations to determine the lifetime of the superconductor in a fusion environment have been performed at temperatures between 323 K and 383 K.

An important corollary to the main discovery of temperature-dependent irradiation damage is that the dominant mechanism by which Jc is degraded is REBCO grain boundary degradation caused by radiation-enhanced diffusion. Since diffusion speed decreases exponentially with temperature reduction, this finding motivates "sub-cooling" of REBCO in fusion magnets far below the critical temperature to promote radiation resistant operation.

Figure 7:
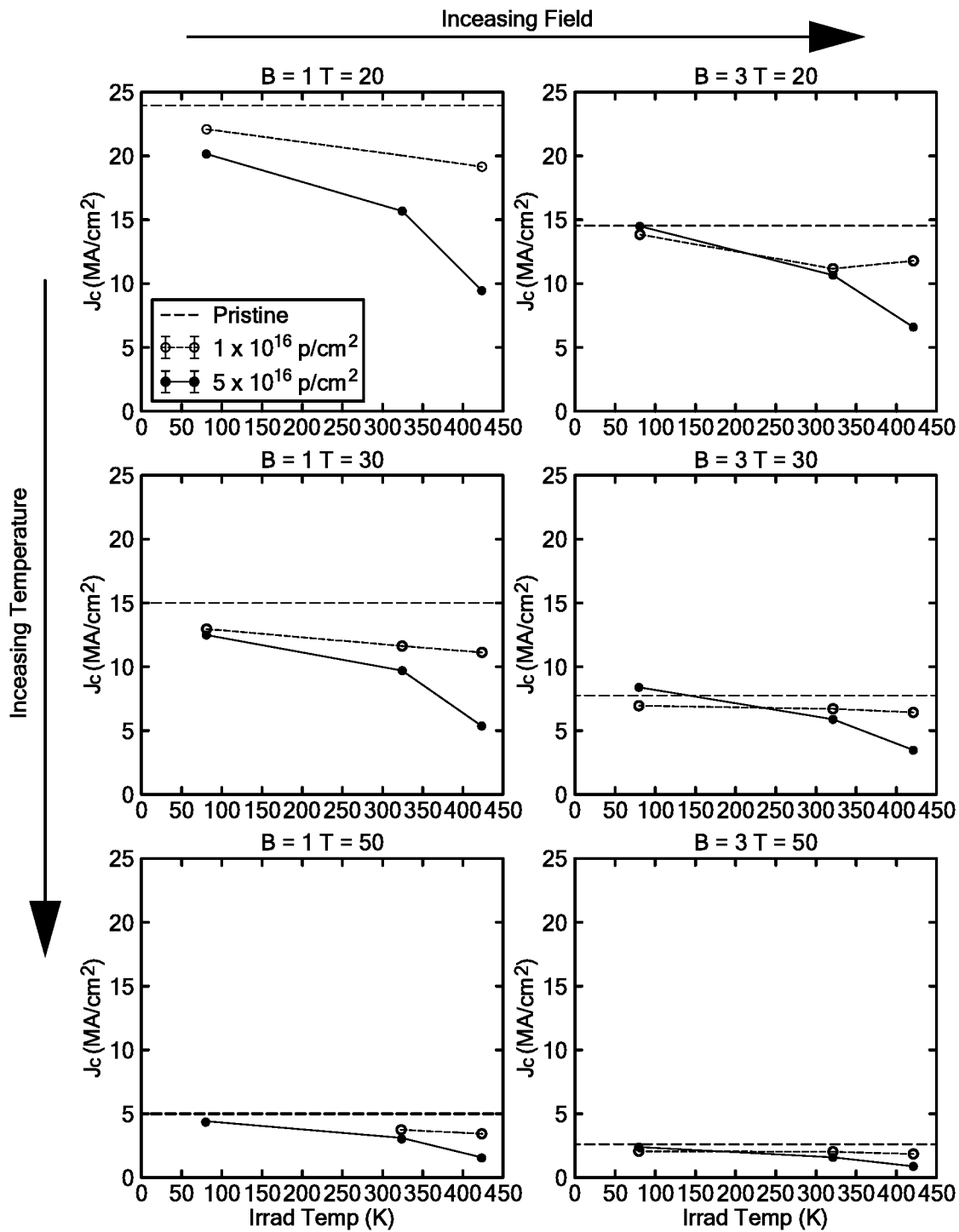
FIG. 7 is a selection of plots illustrating irradiation temperature effect on REBCO Jc degradation due to proton irradiation at various measurement fields and temperatures.
Figure 7:
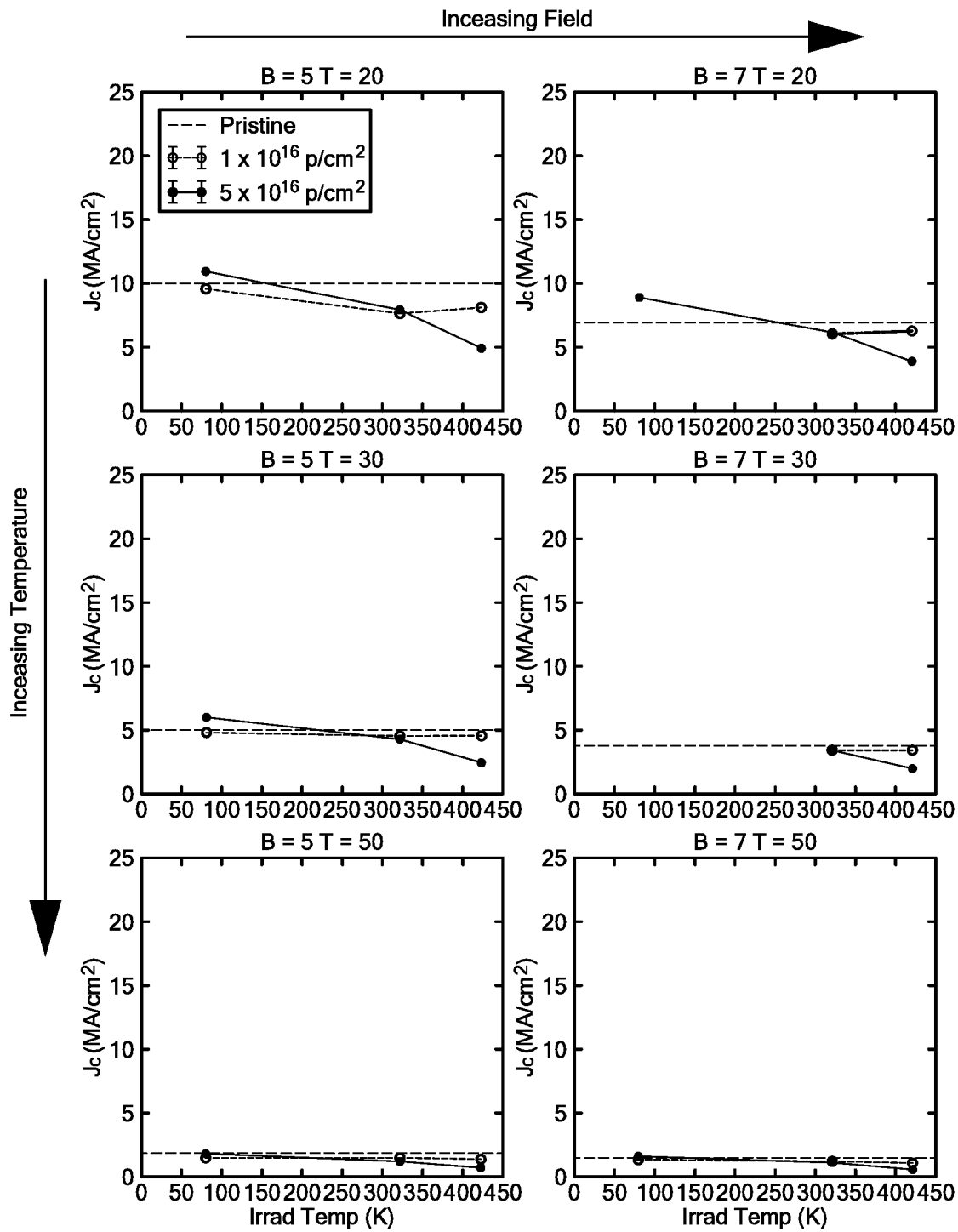

FIG. 7 displays the minimum Jc vs irradiation temperature for a wide variety of operating conditions and fluences. The plots are arranged so that each column is a different magnetic field strength (increasing from left to right) and each row is a different temperature (increasing from top to bottom). Over all of the conditions shown, FIG. 7 indicates that irradiation temperature has a large effect, where the universal trend to Jc degradation is much weaker after cryogenic temperature. This is obviously a result of great importance to superconducting REBCO magnets in fusion applications where the radiation during operating conditions will occur at T<80 K.

Critical Temperature Modifications

Figure 8:
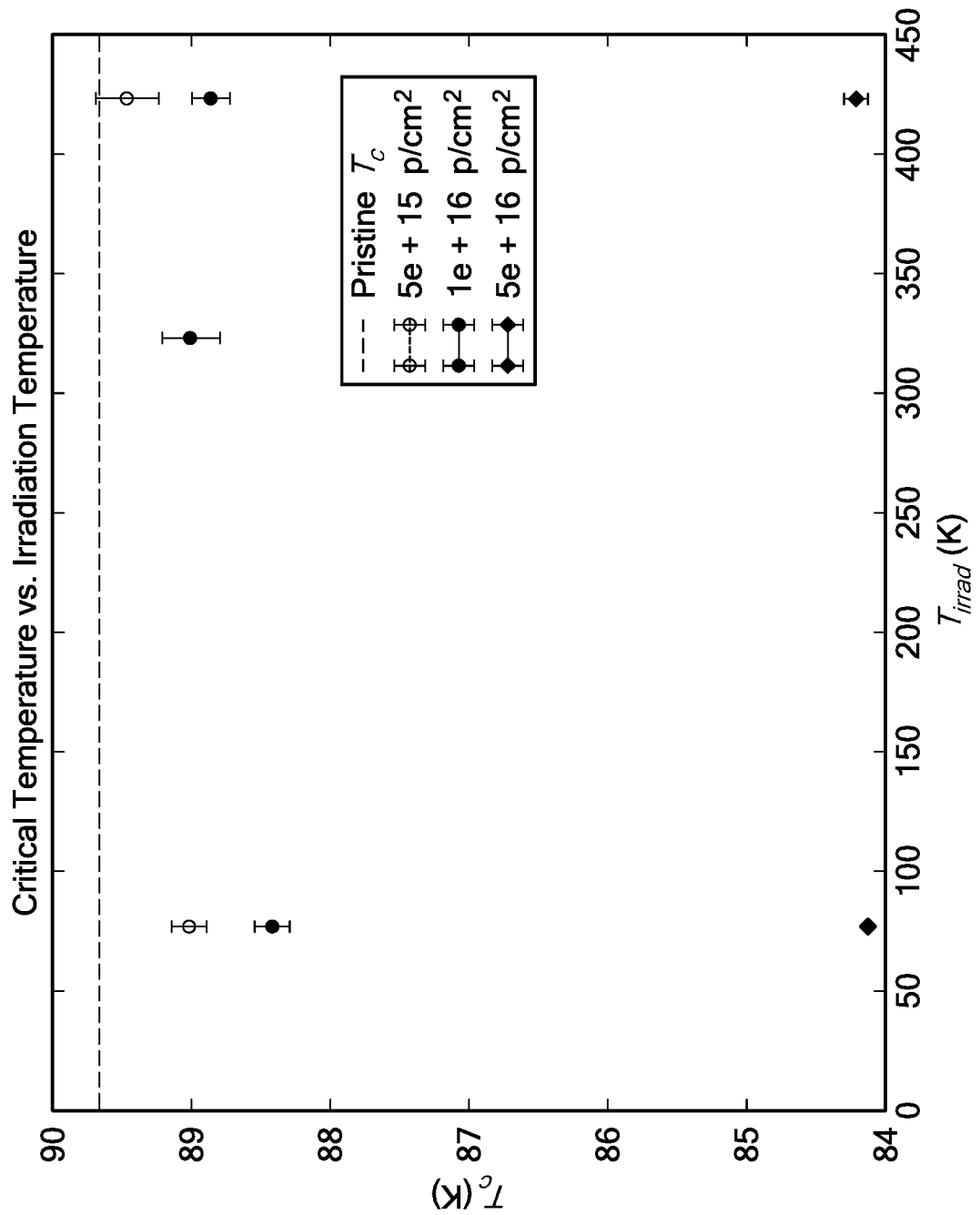
FIG. 8 is a plot of critical temperature of an irradiated superconductor versus the irradiation temperature.

In order to determine the critical temperature, scans of Jc vs. T were obtained and fit using the GL theoretical dependence described in Eq. 1 of the background section above. Critical temperatures were calculated for all irradiated samples and are shown in FIG. 8. The first noticeable trend is that (as expected) the critical temperature Tc decreases as the irradiation fluence increases. Unexpectedly, for all three fluences the critical temperature appears to have a weak to nonexistent dependence on irradiation temperature. There is a clear drop in Tc between $1 \times 10^{16}$ p/cm$^2$ and $5 \times 10^{16}$ p/cm$^2$ fluences. This drop is consistent with the clear break in Jc degradation versus irradiation temperature shown in FIG. 7, and thus suggests the Tc effect is at least correlated to the Jc degradation. Previous studies of low-temperature REBCO irradiations have asserted that between 20 K and 300 K, the irradiation temperature plays a small, if not negligible role in Tc degradation. The results in FIG. 8 indicate that while Tc does not vary strongly with $T_{irrad}$, there is a measurable difference between Tc values for different irradiation temperatures at lower fluences.

Differentiating Strong and Weak Pinning Regions

Figure 5:
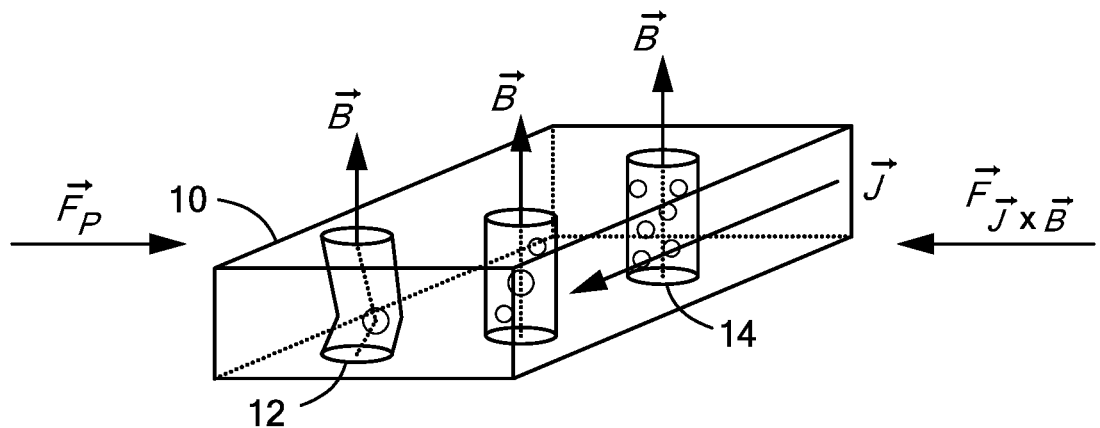
FIG. 5 shows a superconducting material and illustrates the difference between strong and weak pinning sites.
Figure 5A:
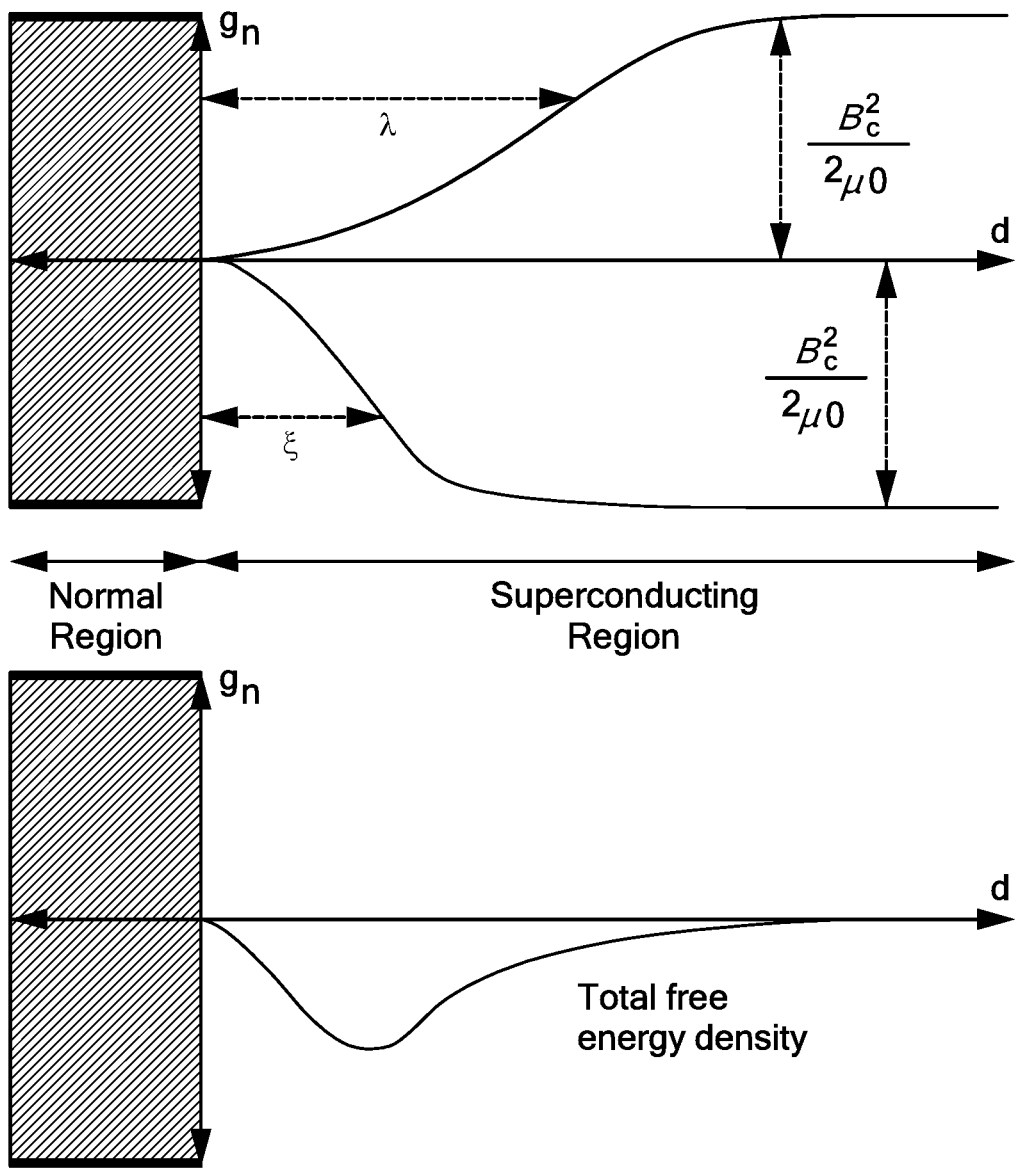
FIG. 5A comprises two plots of (top) free energy density contributions from electron ordering and magnetization, and (bottom) their sum, showing that the normal-superconducting boundary is thermodynamically stable, allowing some flux penetration.

For the purposes of the analysis in the following, it is useful to break the Jc measurement parameter space into two broad regimes: strong pinning and weak pinning. As described above in connection with FIG. 5, strong pinning sites distort the flux line lattice itself and are generally very stable against thermal lattice vibrations, while weak pinning sites act collectively to preserve the shape of the flux lattice and are more prone to being unstable to thermal vibrations. Thus, strong pins are more effective in conditions of high temperature and low field, whereas weak pinning sites are more effective at the low temperature and high fields that may be found in a compact fusion reactor.

One way to characterize these regions is by analyzing the variation of log(Jc) with T. The critical current density dependence on weak pinning has been shown to follow the relationship:

$$J_{c,w} \approx J_{0,w} \times \exp\left[-\left(\frac{T}{T_{0,w}}\right)\right] \quad (5)$$

where $J_{0,w}$ and $T_{0,w}$ are fit parameters proportional to the critical current density and pinning barrier energy at zero temperature (i.e. without thermal fluctuations leading to flux creep and thermally activated depinning). Equation 5 can be used to roughly approximate regions of the data. If the Jc vs T trend fits well to Equation 5 it is deduced that we are in the weak pinning regime, and where the data trend deviates from Equation 5, as T increases, then this is identified as the transition temperature into the strong pinning regime.

Figure 9:
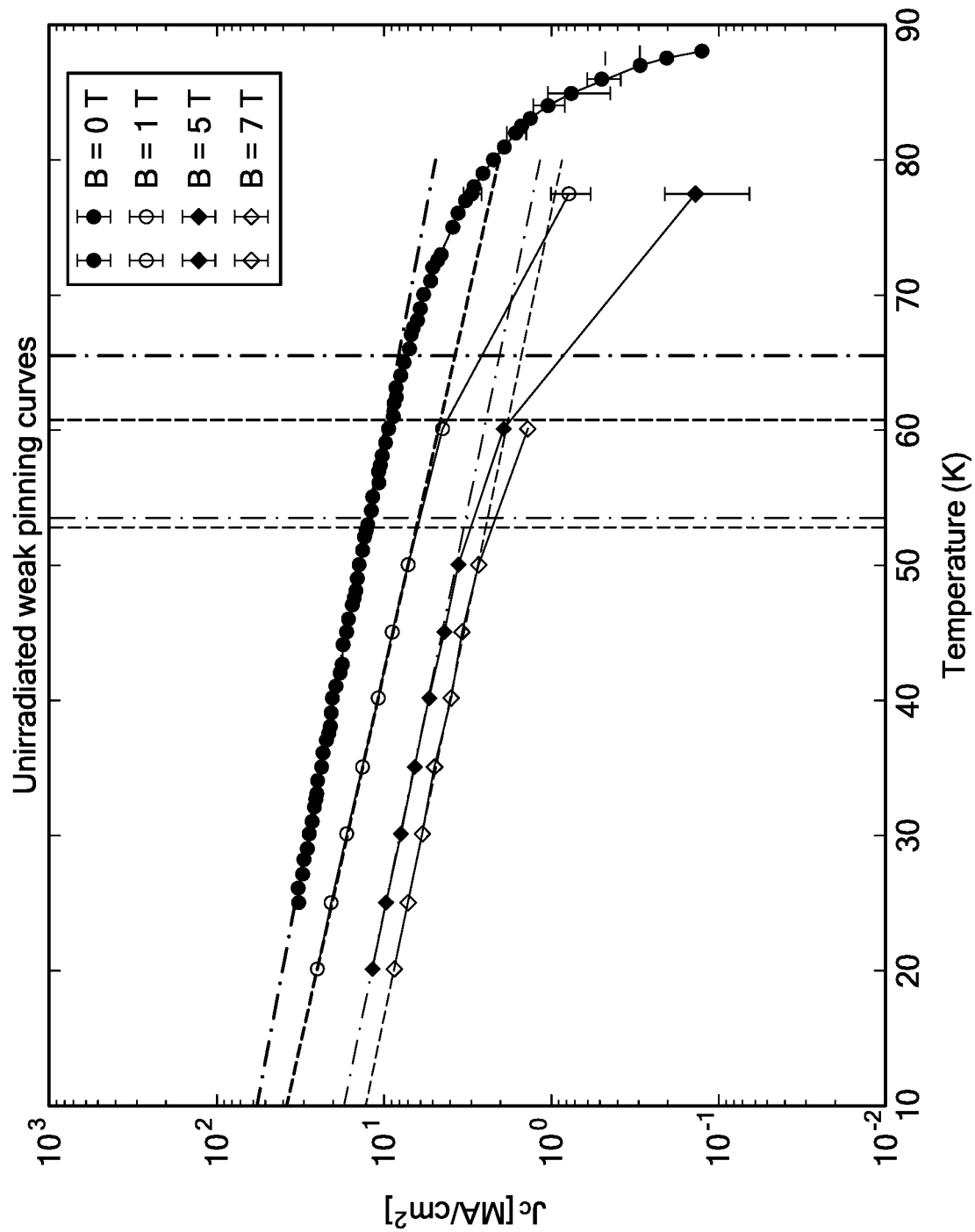
FIG. 9 compares measured critical current density Jc with a fit to the predicted dependence on weak pinning.

FIG. 9 compares the Jc dependences with temperature for several fields (field oriented perpendicular to the tape) in the pristine control sample as well as the sample irradiated to $5 \times 10^{16}$ p/cm$^2$ at 423 K. Dashed vertical lines were plotted to guide the eye to the point where the data deviates from the fit to Eq. 5 by more than 5%. At zero field, the transition temperature between strong and weak pinning occurs at approximately 64 K and steadily decreases as the applied field increases, ending up at about 52 K for B=7 T. While the poor resolution of temperature points in the higher field data means that the true transition temperature could be higher than indicated, the plotted result can be used as an approximate transition temperature.

For the range of measurement fields disclosed herein, then, there is clearly a region of operating temperature below about 40 K that is always dominated by weak pinning and a clear region above about 65 K that is always dominated by strong pinning. This determination may be used to distinguish behavior in one of the two regimes. The range in between these two temperatures is more complicated and appears to depend on the level of irradiation fluence and applied field. Higher fluence and higher applied fields both have the effect of pushing the crossover temperature to lower values. Due to the low resolution of the data, it is difficult to draw strong conclusions about the effect of irradiation temperature on the pinning regimes, although it appears that the transition temperature shifts more strongly as a function of fluence than irradiation temperature.

Jc Vs. θ Comparisons

The main group of high-resolution measurements performed at RRI were high-fidelity angularly-resolved Jc measurements performed at several different temperature and field combinations. FIGS. 10A to 10F show the measured effect of radiation fluence and radiation temperature on the angular Jc dependence under different operating regimes. Each sample was compared to the unirradiated control sample to establish the degree of enhancement or degradation in Jc.

In order to investigate the angular Jc changes in both the strong and weak pinning regimes, two cases were compared for each sample. Based on the results of the previous section, the strong pinning condition was chosen to be 77 K, 1 T, and the weak pinning region was chosen to be 30 K, 5 T. It is important to note that the same behavior in the weak pinning regime was observed down to temperatures of 15 K (as expected), but due to the high measurement currents involved and limitations of the measurement device it was not possible to obtain 15 K measurements for all irradiated samples so 30 K was used as a baseline of comparison.

Figure 10A:
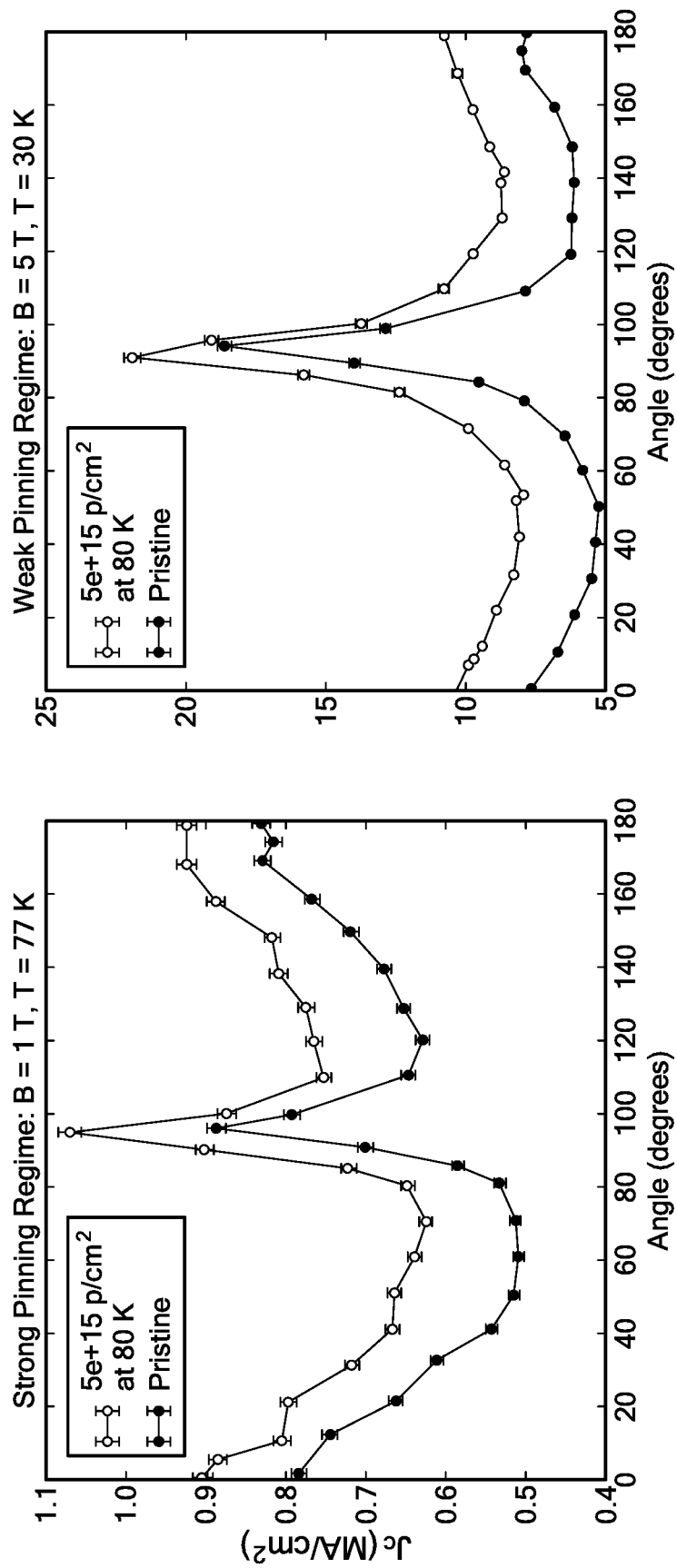
FIG. 10A compares of Jc with measurement angle θ at low temperature, low fluence irradiation (80 K and $5\times10^{15}$ p/cm$^2$)

In FIG. 10A, the critical current density Jc of the sample, following irradiation at 80 K and low fluence ($5 \times 10^{15}$ p/cm$^2$), increases approximately uniformly over the entire range of angles and in both pinning regimes, suggesting the inclusion of effective pinning sites in both regimes due to the irradiation. As irradiation fluence is increased to the medium ($1 \times 10^{16}$ p/cm$^2$) fluence of FIG. 10B and the high ($5 \times 10^{16}$ p/cm$^2$) fluence in FIG. 10C, Jc drops across all angles in the strong pinning regime of superconductor operation. The Jc behavior in the weak pinning regime is more complex. As fluence is increased, Jc at 90 degrees drops. At 0 degrees, however, Jc remains virtually unchanged, and the minimum Jc in the region between 0 and 90 degrees actually increases with fluence. This strongly suggests the addition of coherent weak pinning centers as the fluence is increased, but the destruction of the strong correlated pinning from the Cu—O chain layers.

Figure 10B:
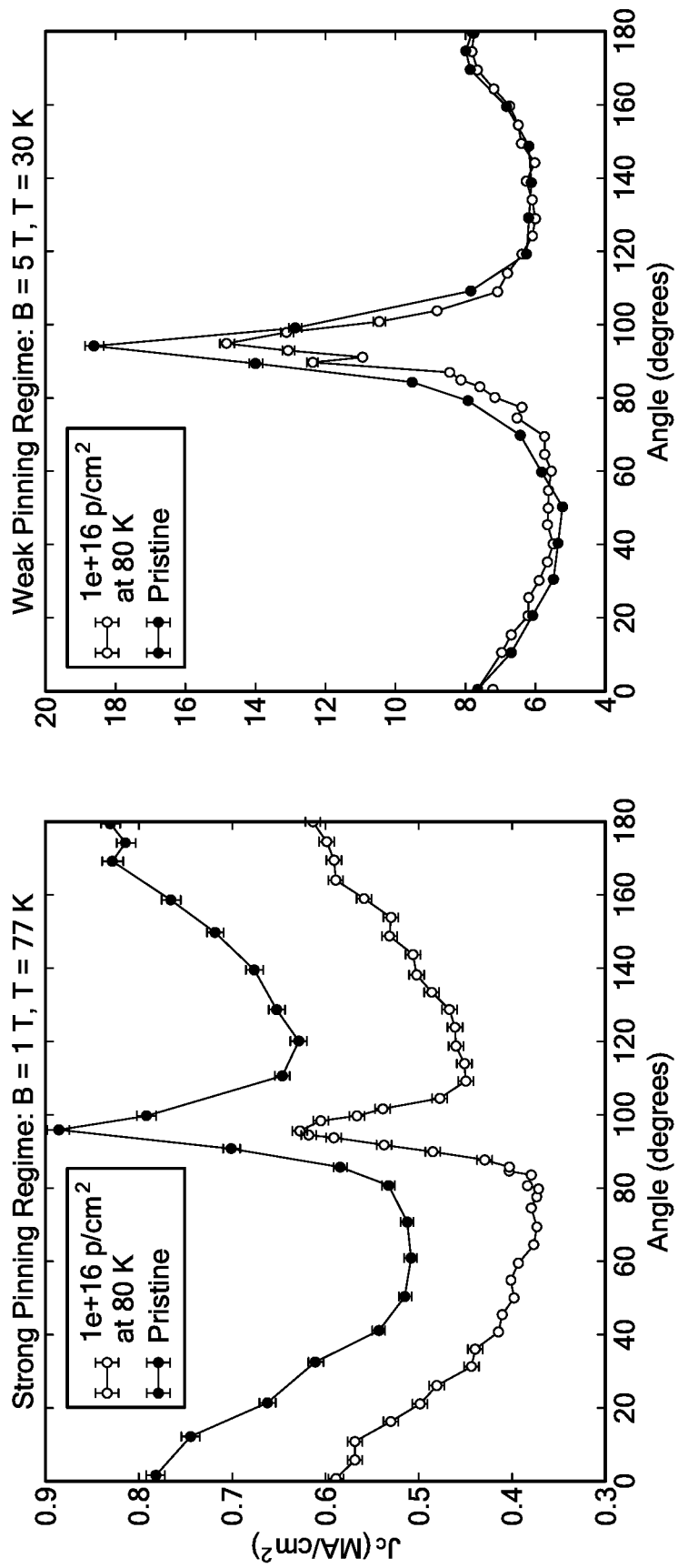
FIG. 10B compares Jc with θ at low temperature, medium fluence irradiation (80 K and $1\times10^{16}$ p/cm$^2$)
Figure 10C:
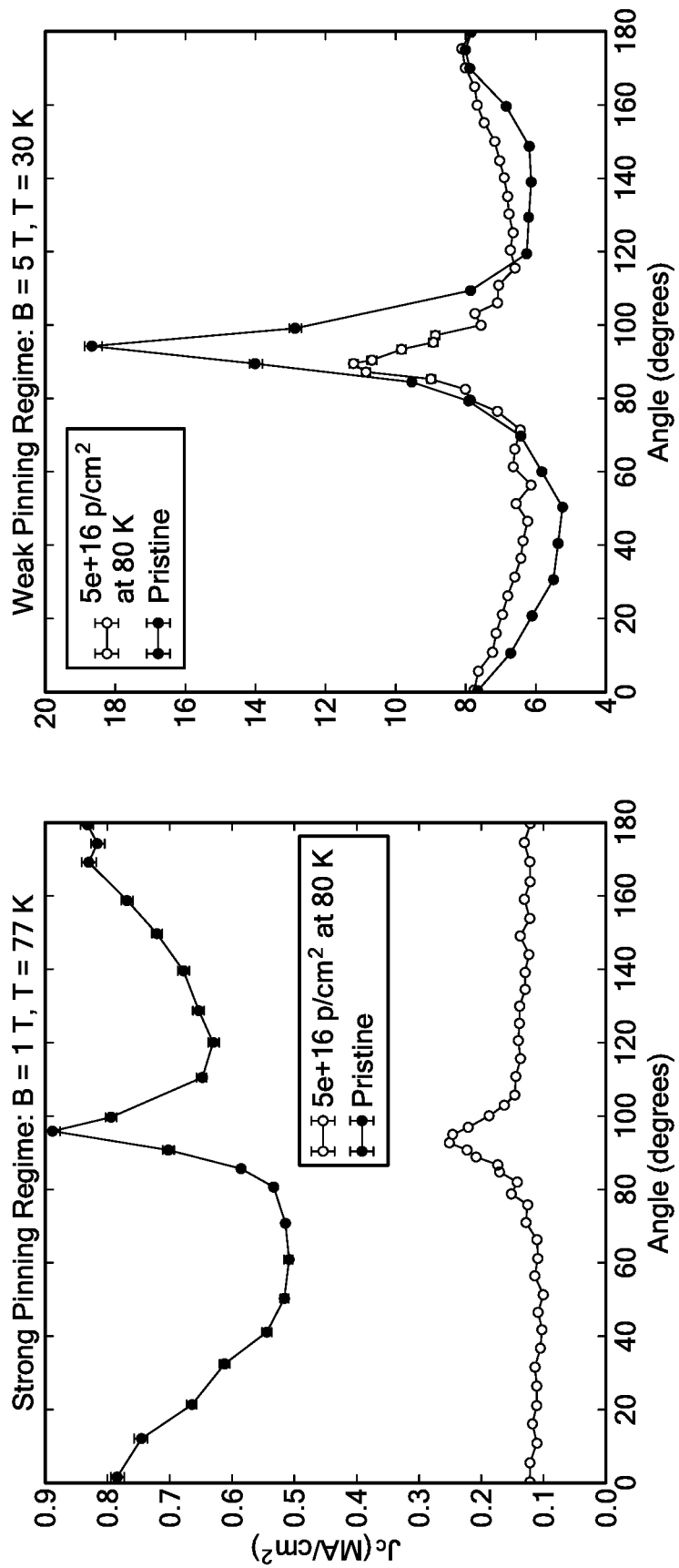
FIG. 10C compares Jc with θ at low temperature, high fluence irradiation (80 K and $5\times10^{16}$ p/cm$^2$)
Figure 10D:
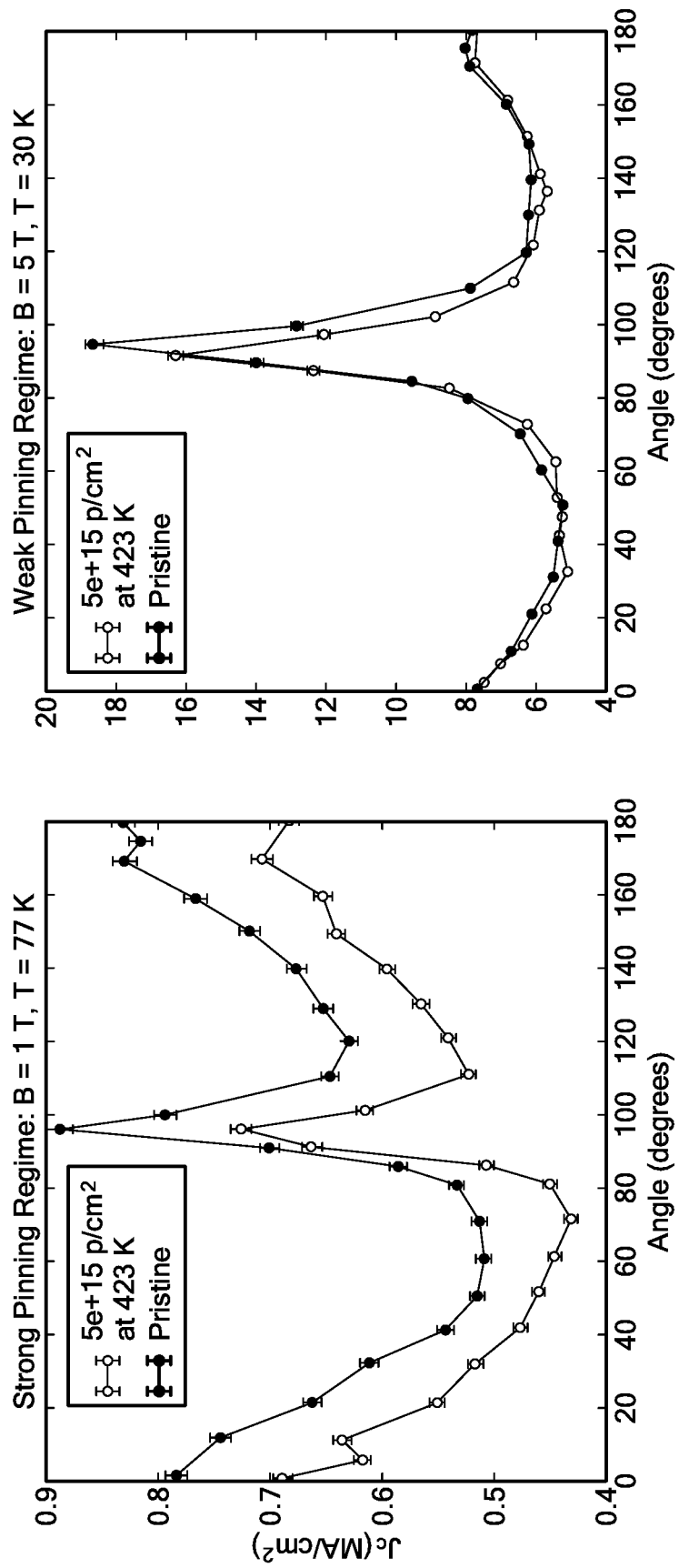
FIG. 10D compares Jc with θ at high temperature, low fluence irradiation (423 K and $5\times10^{15}$ p/cm$^2$)
Figure 10E:
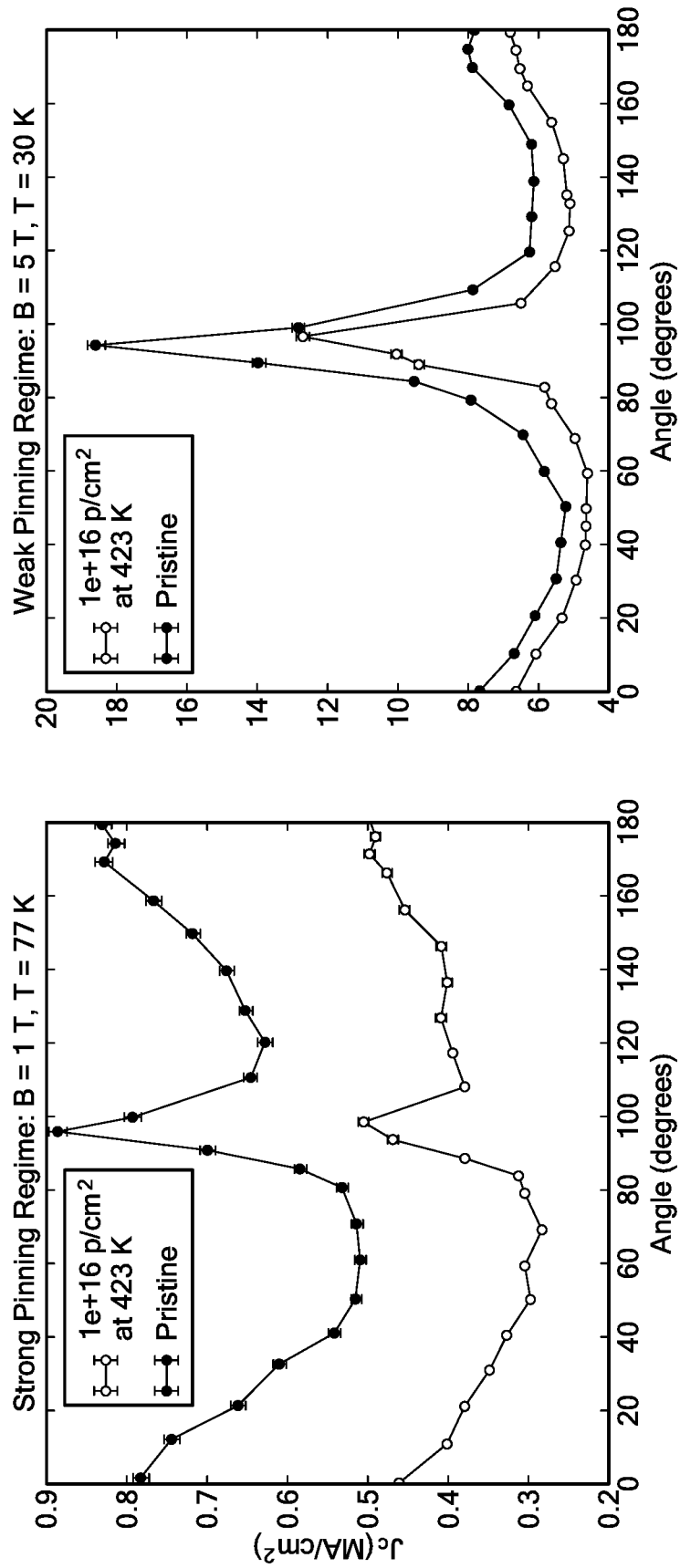
FIG. 10E compares Jc with θ at high temperature, medium fluence irradiation (423 K and $1\times10^{16}$ p/cm$^2$)
Figure 10F:
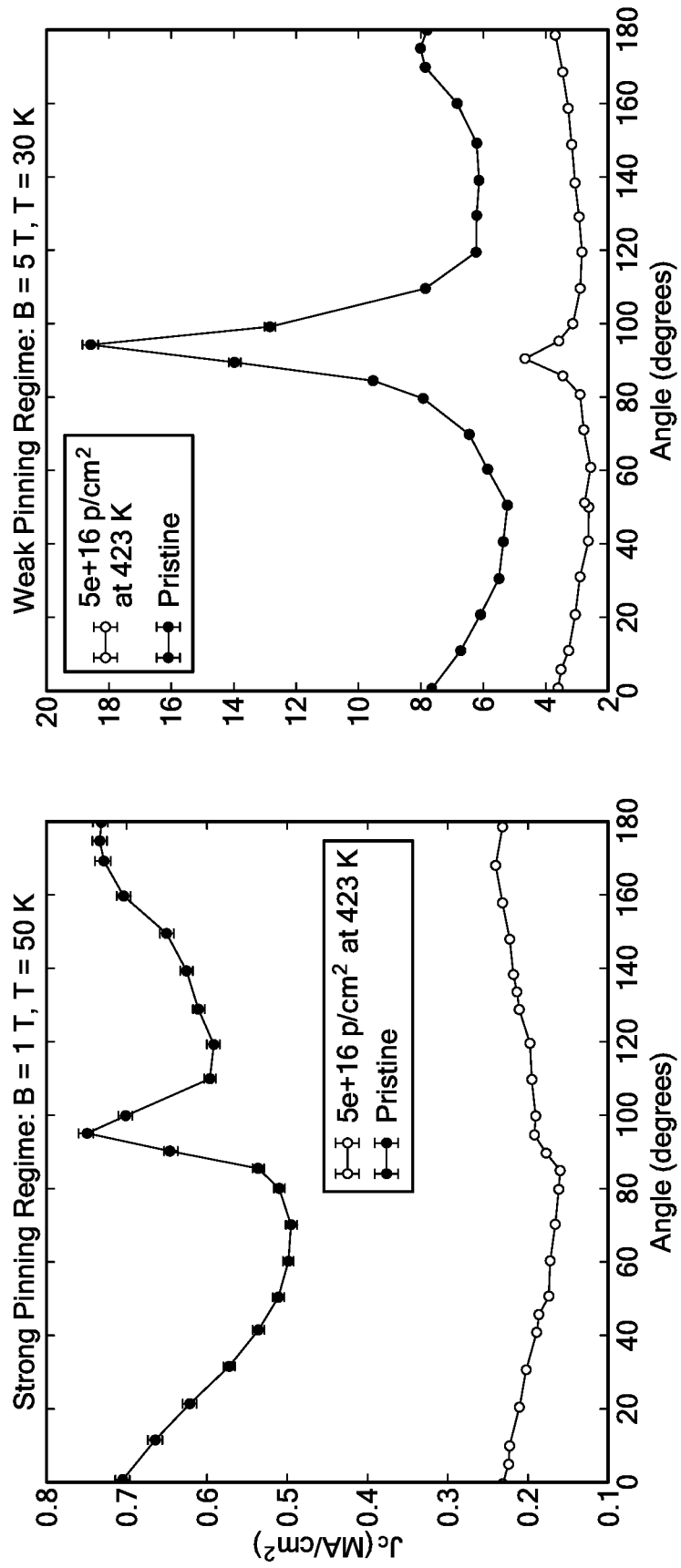
FIG. 10F compares Jc with θ at high temperature, high fluence irradiation (423 K and $5\times10^{16}$ p/cm$^2$)

While FIGS. 10A to 10C show results of irradiation at different fluences at 80 K, FIGS. 10D to 10F show the same range of increasing fluences at the higher irradiation temperature of 423 K. In contrast to the irradiations performed at 80 K, none of the 423 K irradiations produced Jc enhancement for the strong or weak pinning regimes. The decreases in Jc are consistent across all irradiations for measurements performed in the strong regime, with increasing relative Jc degradation at higher fluences. For the first fluence, this degradation is more or less constant in angle, although for the highest irradiation (FIG. 10F) the 90-degree peak appears to almost disappear completely. It should be noted that there were no 77 K measurement data for the strong pinning regime of FIG. 10F because the critical current Ic was too small to be measured, so 50 K measurements were used instead. In the weak pinning regime, Jc also degrades increasingly with higher fluences, although this effect is much more pronounced for the 90-degree peak area compared to other angles.

A comparison of the Jc vs. θ measurements at the two irradiation temperatures suggests that partial destruction of the CuO$_2$ planes occurs at both irradiation temperatures at the higher fluences, as observed by the decrease in the 90-degree peaks. In addition, the decrease in Jc across all angles in the strong pinning region for both irradiation temperatures indicates that large defect cascades are not being produced by the irradiation at either temperature.

Jc vs. B Comparisons

Figure 11A:
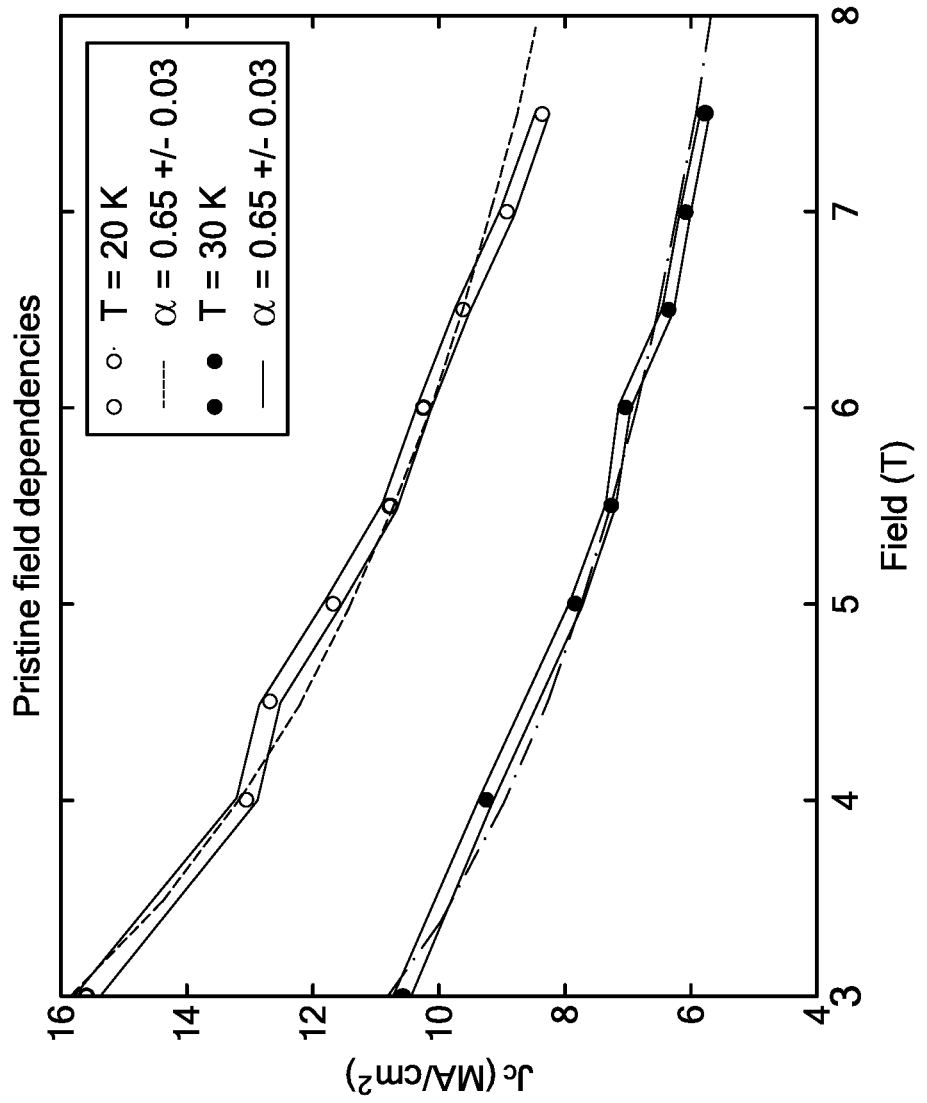
FIG. 11A compares Jc with magnetic field strength B for an unirradiated control sample fitted to a power law.

A common way to study the effects of pinning (in the weak pinning regime) for fields with an angle of 0 degrees is to fit the dependence of Jc to the applied magnetic field B with a power law of the form Jc∝B$^{-\alpha}$ above fields of 3 T. A higher value of α corresponds to a higher sensitivity of Jc to the applied magnetic field (i.e. the Jc degrades more rapidly with increasing B), implying less efficient flux pinning. FIG. 11A shows the field dependencies of Jc for the unirradiated control sample, with α values of approximately 0.65, consistent with previously reported values for unirradiated tape with BZO nanorod dopants.

Figure 11B:
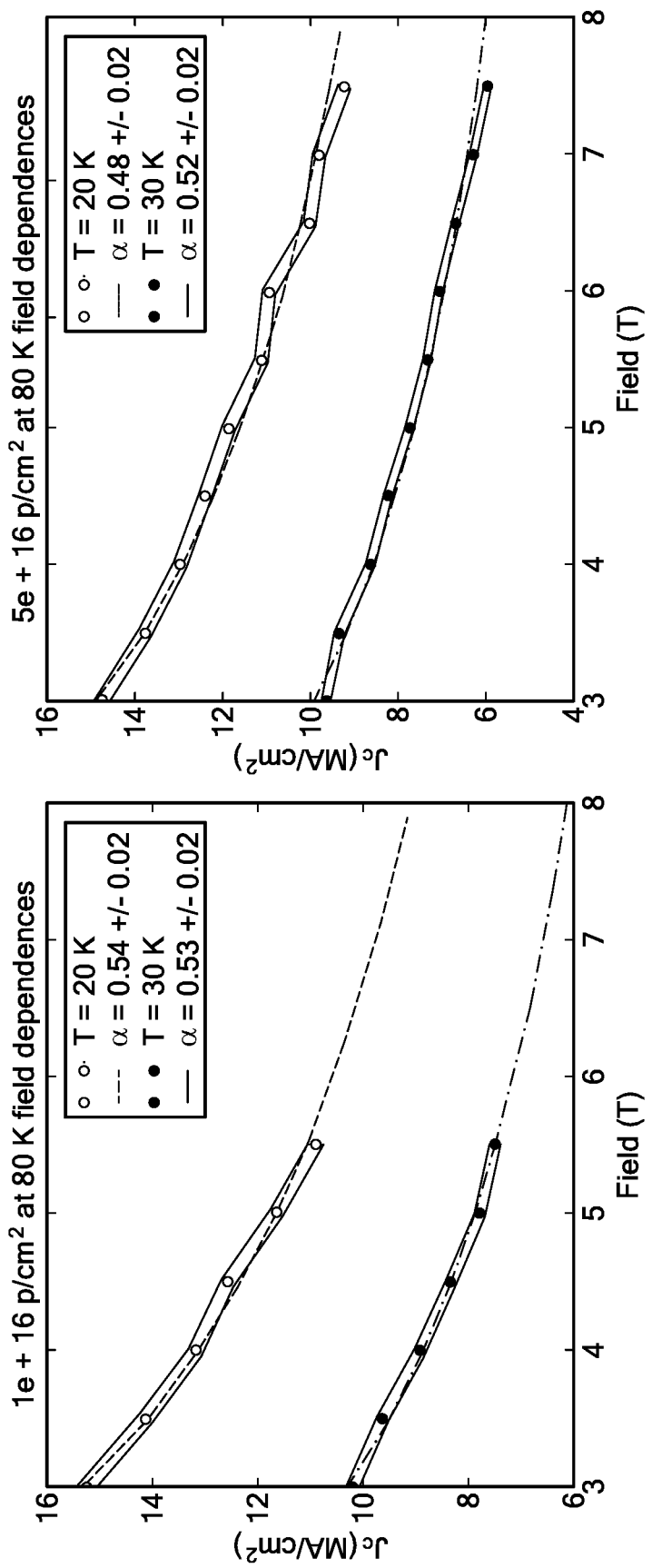
FIG. 11B compares Jc with B for a superconductor irradiated at 80 K to medium and high fluences, with calculated fits to a power law at each fluence.

The first set of B-field dependencies in FIG. 11B for an irradiation temperature of 80 K shows the decrease of α with increasing fluence, suggesting further evidence for the creation of effective weak coherent pinning centers being introduced with irradiation at this temperature. The decrease of α at lower operating temperatures suggests small scale-size defects which would be more effective pinning sites as ξ decreases with T. From a practical view, a lower α is highly attractive because it flattens the Jc vs. B curve and improves tape viability at high absolute magnetic fields that may be present in compact tokamak reactors.

Figure 11C:
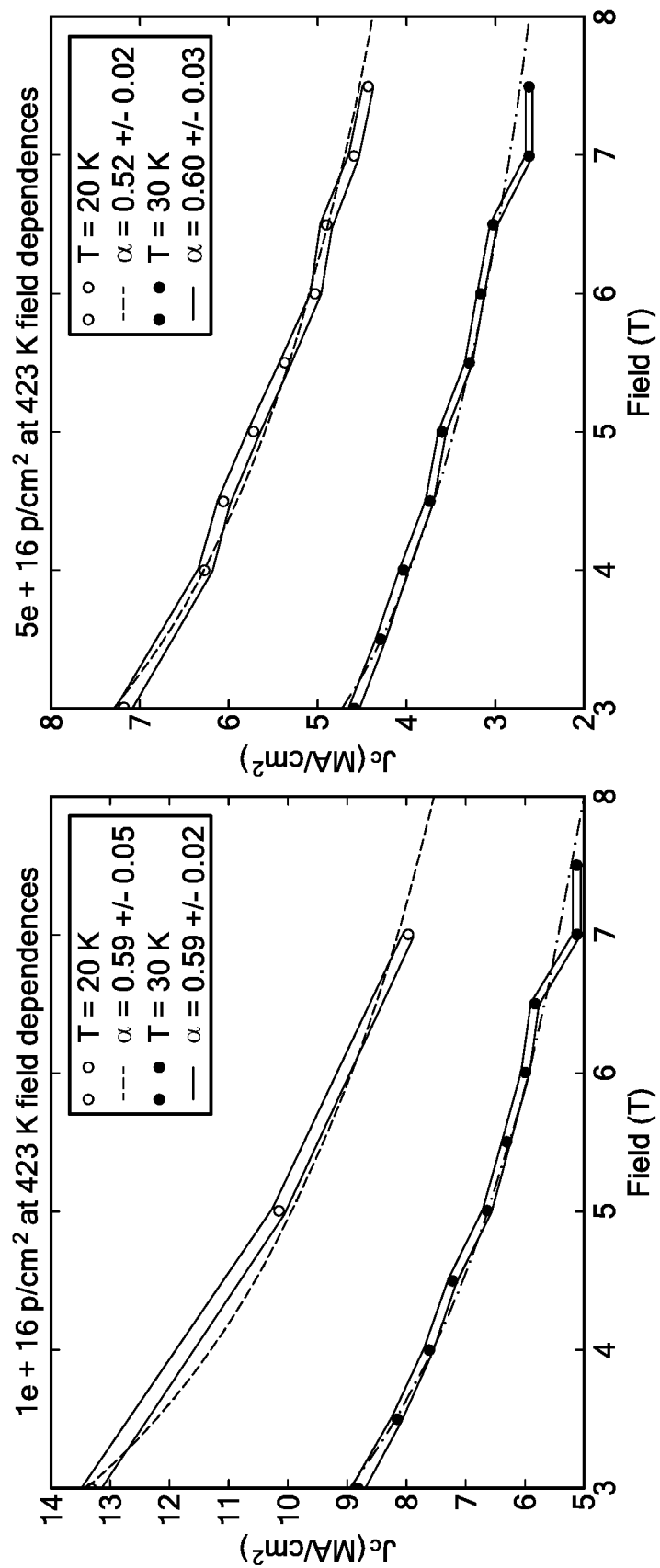
FIG. 11C compares Jc with B for a superconductor irradiated at 423 K to medium and high fluences, with calculated fits to a power law at each fluence.

The second set of B-field dependencies in FIG. 11C for an irradiation temperature of 423 K also shows the decrease of α with increasing fluence and decreasing operating temperature, suggesting that small, effective weak pinning sites are also being produced at this irradiation temperature. However, this decrease in α is smaller, and is also accompanied by a decrease in absolute Jc, unlike the irradiations at 80 K.

The combination of these results implies that the higher-temperature irradiations have less of an effect at suppressing the creation of pinning sites than amplifying the amount of damage done to the superconductor by irradiation, although the creation of pinning sites may be slightly more effective at the lower temperature irradiation. Another possibility is that enhanced defect mobility at the higher temperature irradiation means that point defects (i.e. pinning sites) migrate to grain boundaries faster, leaving less effective pinning sites in the superconducting region. Since both high and low irradiation temperatures lead to a decrease in alpha, this apparently eliminates the possibility that the dependence in irradiation temperature is due to a different pinning mechanism, destruction, or creation at the different temperatures. Note this is consistent with the lack of dependence on irradiation temperature of the crossover temperature for the dominant pinning mechanism.

Grain Boundary Vs. Pinning Region

With Tc suppression and the creation or destruction of pinning sites eliminated as mechanisms behind the difference in Jc between high and low-temperature irradiation, the two remaining possible explanations for the much higher degradation of Jc in the 423 K irradiated samples are lattice amorphization and grain-boundary amorphization. Since the highest fluence irradiation performed ($5 \times 10^{16}$ p/cm$^2$) corresponds to a DPA of about 0.003, the creation of a cellular microstructure due to lattice amorphization within grains is not expected. In order to investigate grain boundary disordering, irradiated and control curves of Jc vs. B were analyzed to find the crossover region where grain-boundary limited Jc transitions to pinning-limited Jc, as described above.

FIGS. 12A to 12D show crossover between grain-boundary limited Jc and pinning limited Jc regimes for irradiations at 80 K. At the low fluences below $1 \times 10^{16}$ p/cm$^2$ of FIGS. 12A and 12B, there is no crossover. As fluence is increased to $1 \times 10^{16}$ p/cm$^2$ of FIG. 12C and $5 \times 10^{16}$ p/cm$^2$ of FIG. 12D, where noticeable changes in Jc vs. θ are found, then the crossover appears and increases from about 4.5 to about 5.5 T between these two fluences. This behavior of increasing crossover field with fluence is consistent with results in the literature and is also observed for the 323 K and 423 K irradiation series disclosed herein.

Figure 12A:
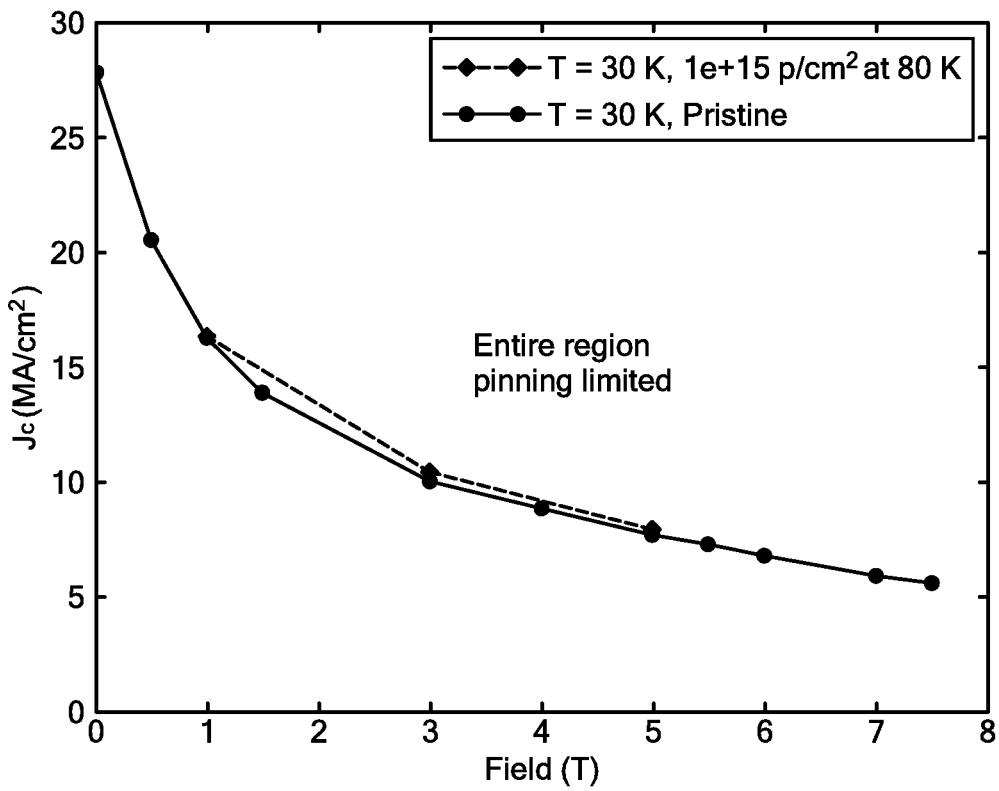
FIG. 12A is a plot of pinning limited Jc for irradiation at 80 K to a low fluence of $1\times10^{15}$ p/cm$^2$.
Figure 12B:
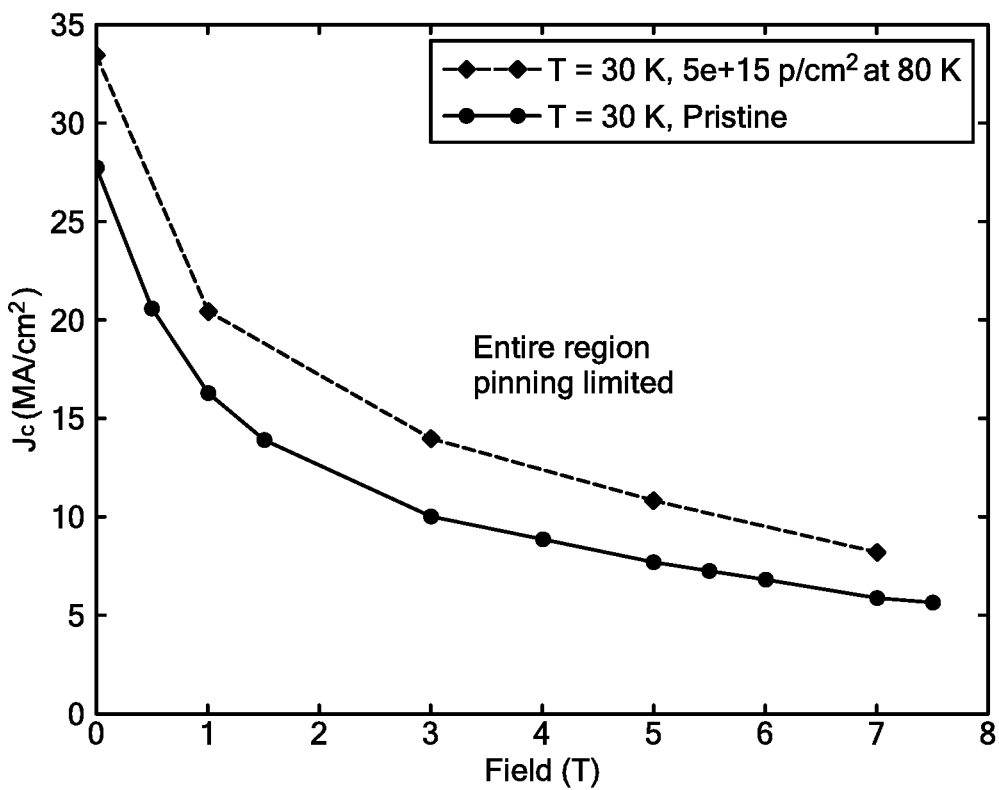
FIG. 12B is a plot of pinning limited Jc for irradiation at 80 K to a low fluence of $5\times10^{15}$ p/cm$^2$.
Figure 12C:
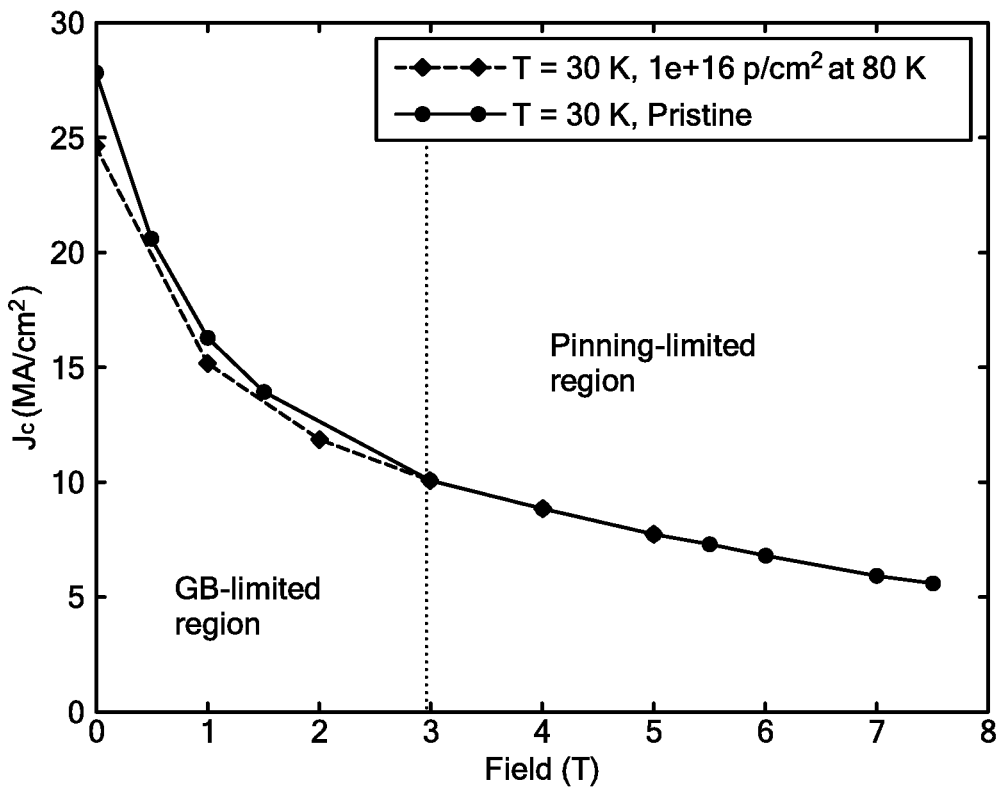
FIG. 12C is a plot showing crossover between grain-boundary limited and pinning limited Jc regimes for irradiation at 80 K to a moderate fluence of $1\times10^{16}$ p/cm$^2$.
Figure 12D:
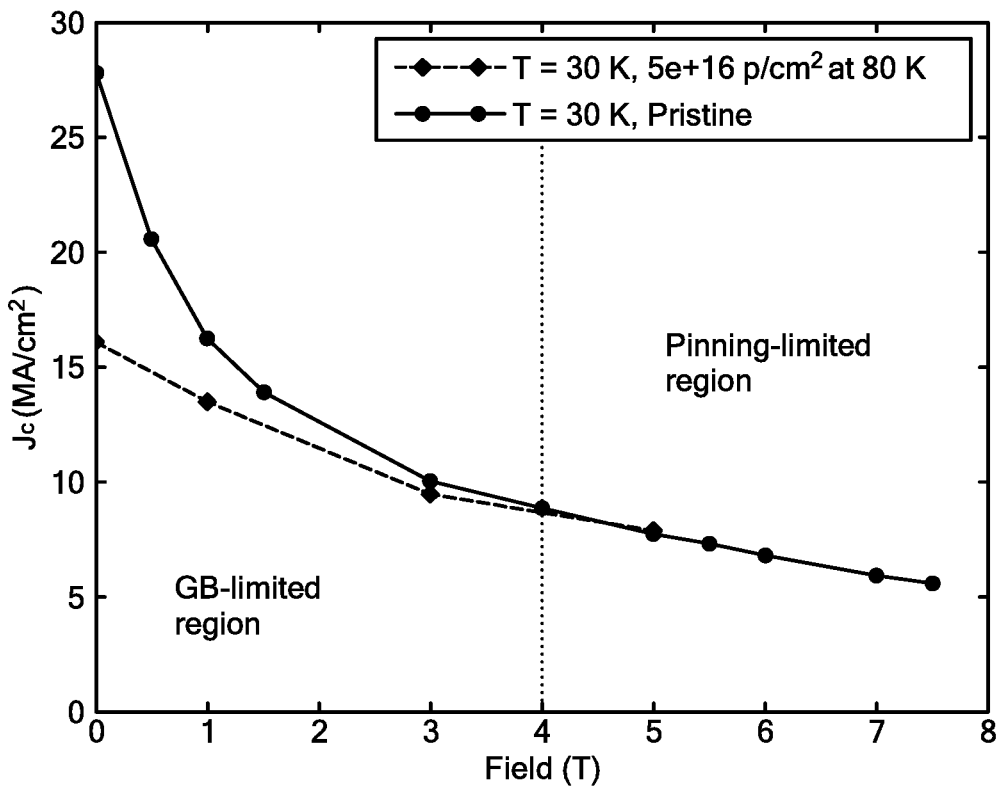
FIG. 12D is a plot showing crossover between grain-boundary limited and pinning limited Jc regimes for irradiation at 80 K to a high fluence of $5\times10^{16}$ p/cm$^2$.

It should be noted that at the two higher fluences of FIGS. 12C and 12D, irradiation appears to have two distinct effects on the Jc vs. B curves which influence the location of the crossover field. The first effect is a gradual "flattening" of the slope of the curve, which was discussed above as being due to the increase of beneficial pinning centers which lower the value of α and lead to less Jc degradation at higher fields. The second effect is a reduction in Jc over the entire range of applied fields, effectively shifting the irradiated curve downwards. This downward shift represents the effect of grain boundary disorder. As discussed above, as the REBCO sample is irradiated, its grain boundaries act as sinks to defects and become widened, creating progressively stronger barriers to transport current. As the sample's grain boundaries become wider, the Jc will decrease at all applied fields.

Figure 13:
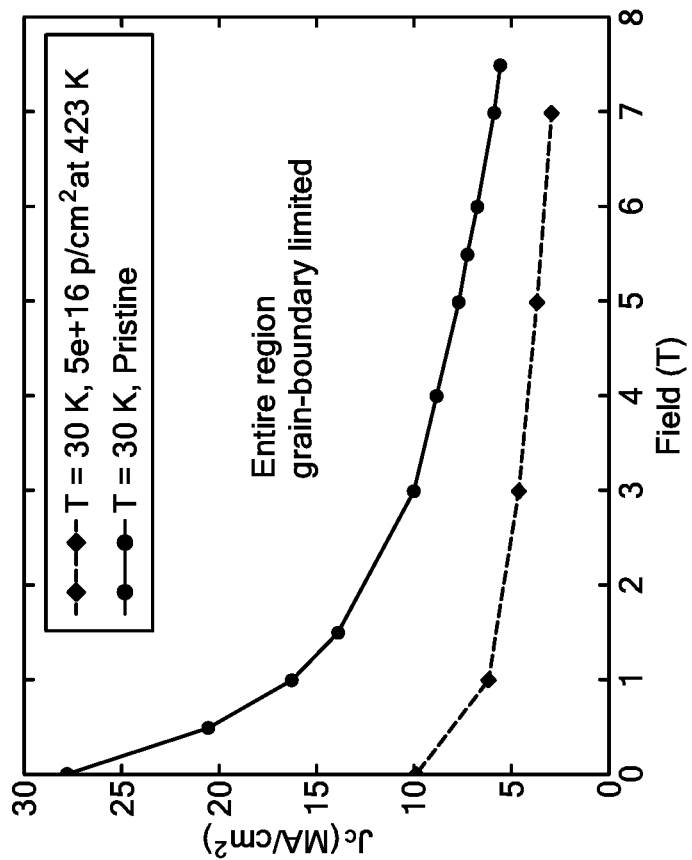
FIG. 13 compares Jc regimes for 80 K and 423 K irradiation to the high fluence.
Figure 13:
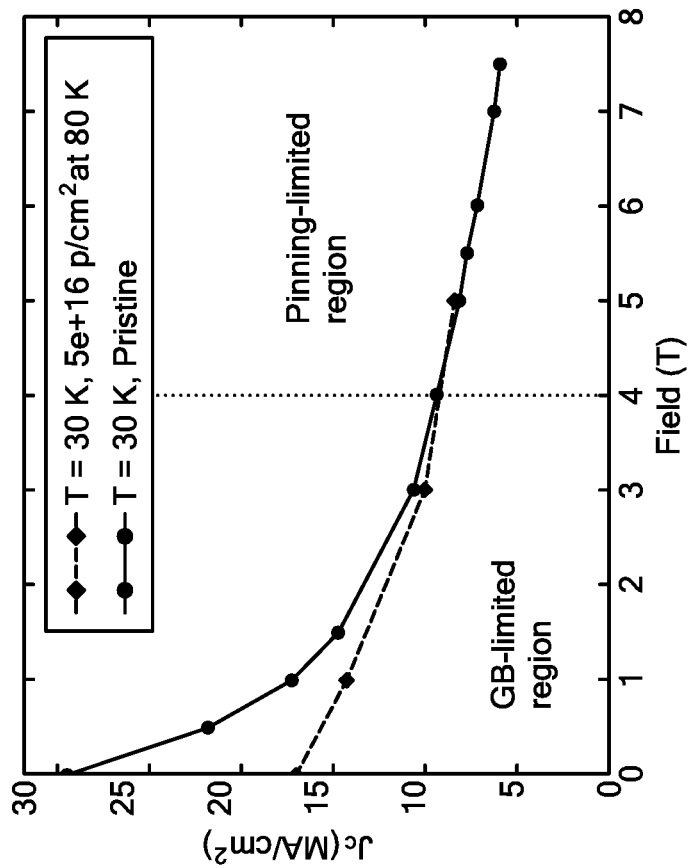

In FIG. 13, the 80 K and 423 K irradiations at a fluence of $5 \times 10^{16}$ p/cm$^2$ are compared. At this fluence, the 423 K irradiation curve (on the right) has shifted downwards far enough that the crossover field (if it even exists) was beyond the capability of the available testing magnet. The lack of an observed crossover field suggests that Jc over the entire field region is grain boundary transport limited. When compared to the low-temperature irradiation at the same fluence (on the left) with a crossover field of about 5.6 T, this strongly suggests that grain boundary damage occurs at a much faster rate when a sample is irradiated at elevated temperatures. The large differences in crossover field between cryogenic and heated irradiations at the same fluence indicates that grain boundary disordering is likely the most dominant effect behind the globally observed differences in Jc for different irradiation temperatures.

Comparison with Molecular Dynamics Modeling

To guide and interpret the experimental studies above, a simulation workflow was developed by combining several software components. The first was DART, a binary collision approximation code developed by the French Commissariat à l'Energie Atomique. The second was SRIM, a Monte Carlo simulator for the Stopping and Range of Ions in Matter developed by James Ziegler and Jochen Biersack, used to model proton irradiation. The third was MCNP, a Monte Carlo simulator for N-Particle radiation developed by the Los Alamos National Laboratory, used to model neutron irradiation for comparison. The fourth code was LAMMPS, a Large-scale Atomic/Molecular Massively Parallel Simulator developed by the Sandia National Laboratories.

First, the irradiating particle energies were found. For ion irradiation, the HTS superconducting tape geometry and composition was modeled in SRIM, and simulated particles of desired energy and species were sent into the material to determine particle energy at the superconducting layer. For fusion irradiation conditions, a MCNP model was used to determine the neutron energy spectrum at the inner midplane position of the fusion magnet. The ion energy or neutron energy spectrum was then passed as an input to the DART code, along with the experimentally measured (for ion irradiation) or predicted (for neutron) fluxes as well as the material composition of YBCO as described above. The DART code then output a cumulative distribution function of primary knock-on atom (PKA) energies generated by an incident irradiation particle. Using a representative sample of PKA energies generated by DART, molecular dynamics simulations on a $YBa_2Cu_3O_7$ lattice generated in VESTA (the Visualization for Electronic and Structural Analysis program developed by Koichi Momma at the Japanese National Museum of Nature and Science) were performed using LAMMPS on the Idaho National Laboratory's Falcon supercomputer. The results of the LAMMPS simulations were post-processed and analyzed in the OVITO (Open Visualization Tool) scientific data visualization package developed by Alexander Stukowski. Multiple simulations were performed to compare the results of using different ion energies, incident particle directions, and irradiation temperatures with the ultimate goal of understanding the mechanisms behind the experimental results and applying them to fusion conditions.

Figure 1:
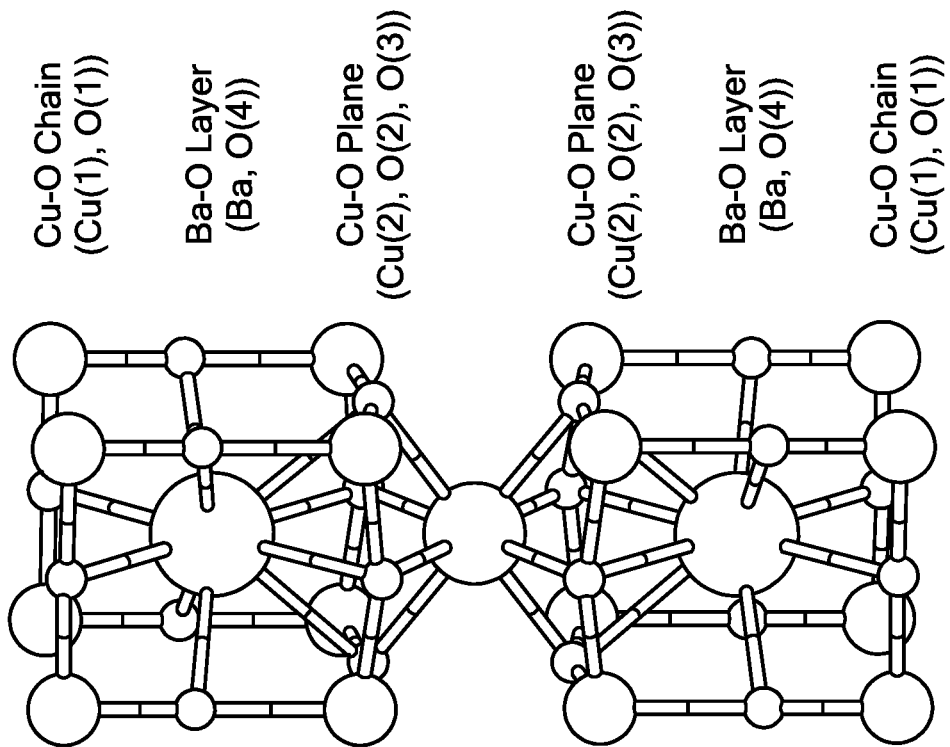
FIG. 1 shows an illustrative crystal structure for a rare-earth barium copper oxide ("REBCO") compound.
Figure 1:
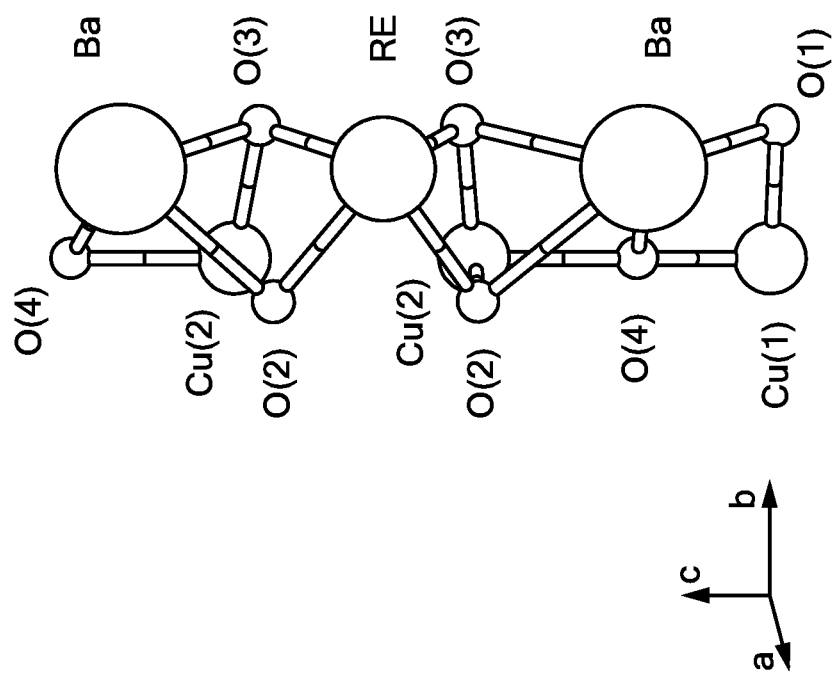

In order to provide a large enough volume to allow full displacement cascades to propagate, a YBCO unit cell (see FIG. 1) was constructed using the VESTA visualization software and repeated to create a 40×40×16 unit cell simulation volume of $YBa_2Cu_3O_7$ with the a, b, and c axes corresponding to the orthogonal [100], [010], and [001] directions. This corresponds to an approximately 15 nm×15 nm×19 nm volume of YBCO and was chosen to be large enough to allow cascades up to 10 keV to take place entirely within the volume but small enough to allow for a tractable computation time. Periodic boundary conditions were assigned to the faces of the volume. In order to model the potentials between atoms in the model, the four-part potential of Chaplot was utilized for long-range interactions and the Ziegler-Biersack-Littmark (ZBL) screened potential was used to model short-range (i.e. knock-on) interactions.

Defect Formation Comparisons

Figure 14:
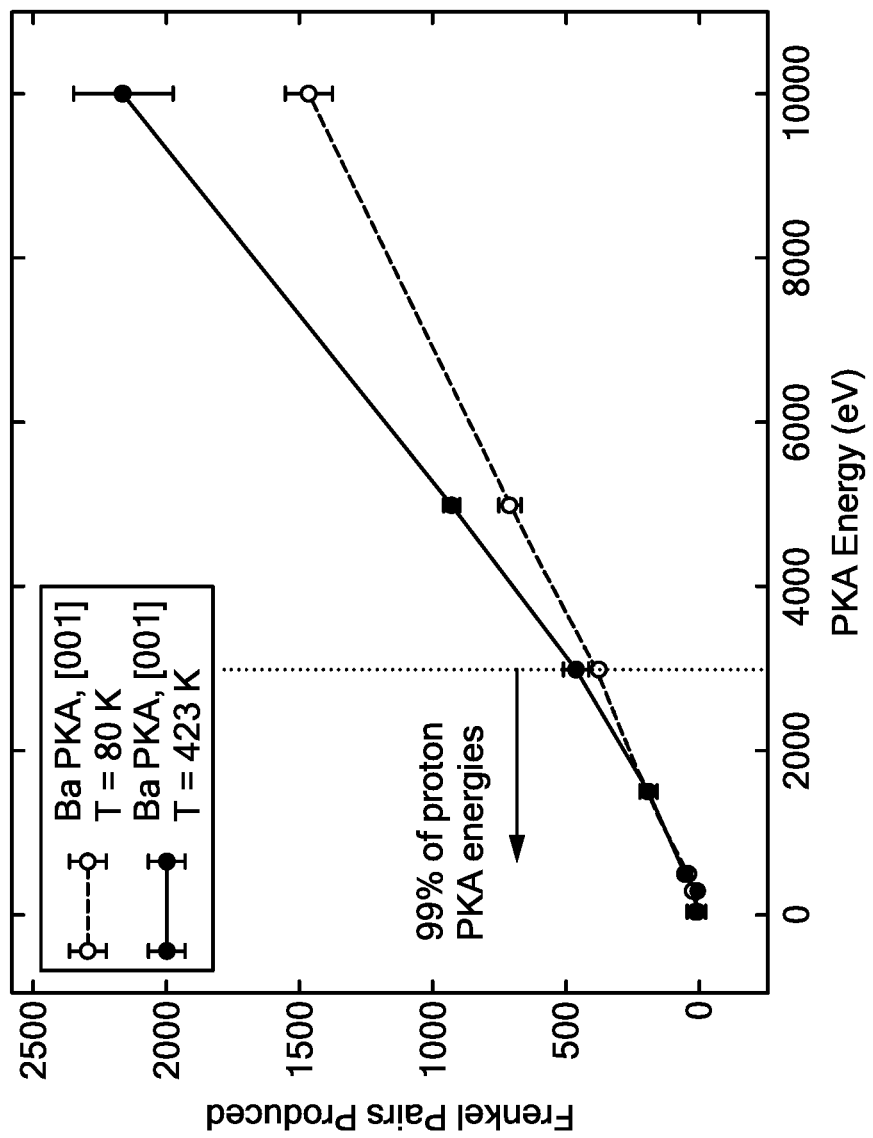
FIG. 14 is a plot of simulated Frenkel pair production per primary knock-on atom (PKA) vs. PKA energy for irradiations at 80 K and 423 K.

To evaluate defect formation for various PKA energies, a Wigner-Seitz defect analysis was performed using the OVITO package at t=30 picoseconds (ps) using the time t=0 frame as a reference. Cluster analysis was performed using a baseline Frenkel pair ("FP") generation threshold to determine the cutoff radius for selection of the cluster, effectively "filtering out" the FPs produced by thermal motion from the defects. A comparison between the 80 K and 423 K proton irradiation conditions was performed by computing the number of Frenkel pairs generated for a number of different PKA energies. Each energy condition was simulated three times to determine a mean value and standard deviation of FP generation for each energy. FIG. 14 compares the FP generation at the two temperatures and shows that at low energies, approximately equal numbers of Frenkel pairs are produced in a cascade, whereas at energies≥1 keV the curves begin to diverge, and more FPs are generated at the higher irradiation temperature.

Figure 15:
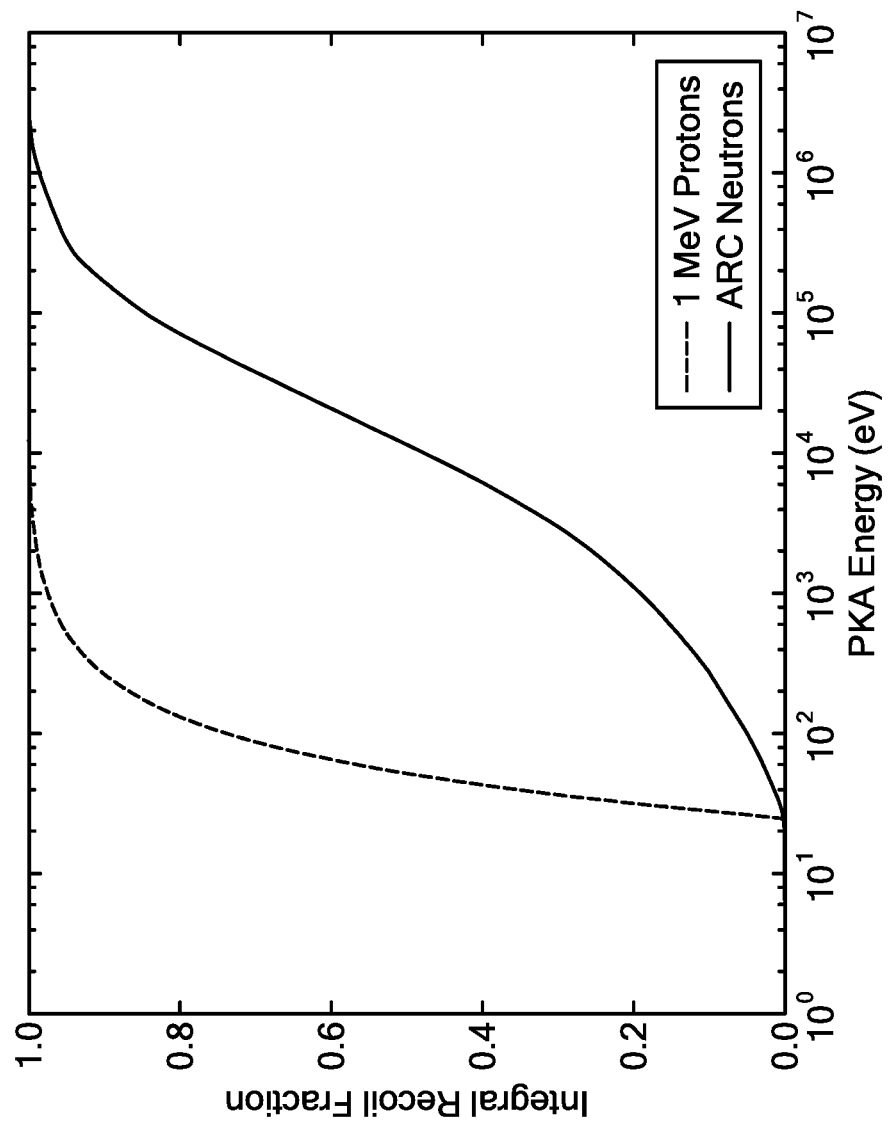
FIG. 15 compares cumulative distribution of PKA energy functions resulting from 1 MeV protons and neutrons according to a compact fusion model (denoted "ARC")

With regards to the proton irradiations, the results described above indicate that at higher temperatures, the higher energy (E≥1 keV) PKAs produce successively more damage than the low energy PKAs. However, the PKA energy distribution function shown in FIG. 15 shows that PKA energies above 1 keV (i.e. $10^3$ eV) are very rare and only make up a few percent of all collisions. Even at the very rare PKA energy of 10 keV (i.e. $10^4$ eV) shown in FIG. 14, the ratio between high-temperature and low-temperature FP generation is only about 1.5, a ratio which decreases as the PKA energy is lowered. Thus, the effect of irradiation temperature on cluster formation was not expected to play a large role in the Jc degradation effects observed experimentally for ion irradiations.

Oxygen Diffusion in YBCO

Another way in which irradiation could influence the microstructure of YBCO is through radiation-enhanced diffusion of defects to grain boundaries. As a material is irradiated, the simplified radiation-enhanced diffusion coefficient can be given as:

$$D_{rad} = D_v C_v + D_i C_i \quad (6)$$

where Dv and Di are the vacancy and interstitial diffusion coefficients and Cv and Ci are the vacancy and interstitial concentration fractions, respectively. As Cv and Ci are increased during irradiation, the diffusion coefficient (at a given temperature) is also increased. The results of the previous section indicate that for ion irradiation, defect size is not substantially affected by irradiation temperature, so increases in Cv and Ci due to the creation of Frenkel pairs during irradiation would be expected (on short timescales) to be similar for both high and low temperatures. However, the unirradiated diffusion coefficients are highly dependent on irradiation temperature, as will be shown below.

Mean-Square-Displacement ("MSD") Simulations

In order to determine the diffusion coefficient when the system is in thermal equilibrium (and is not being irradiated), a mean-square-displacement ("MSD") analysis was performed in LAMMPS. First, the simulation volume was relaxed for 100 ps from an initial configuration where the velocity of each atom is randomly selected from a distribution centered at the target temperature. After the system relaxation, the motion of atoms relative to the reference state was tracked, and the atomic displacement lengths were recorded along each primary direction for each atom and then averaged over all the atoms in the simulation volume to give mean values of displacement in each principle direction (dx, dy, and dz) at each timestep. The total mean-squared displacement (MSD) was determined by adding the squared directional contributions as:

$$\langle r^2(t) \rangle = \langle dx_2(t) \rangle + \langle dy^2(t) \rangle + \langle dt^2(t) \rangle \quad (7)$$

Figure 16:
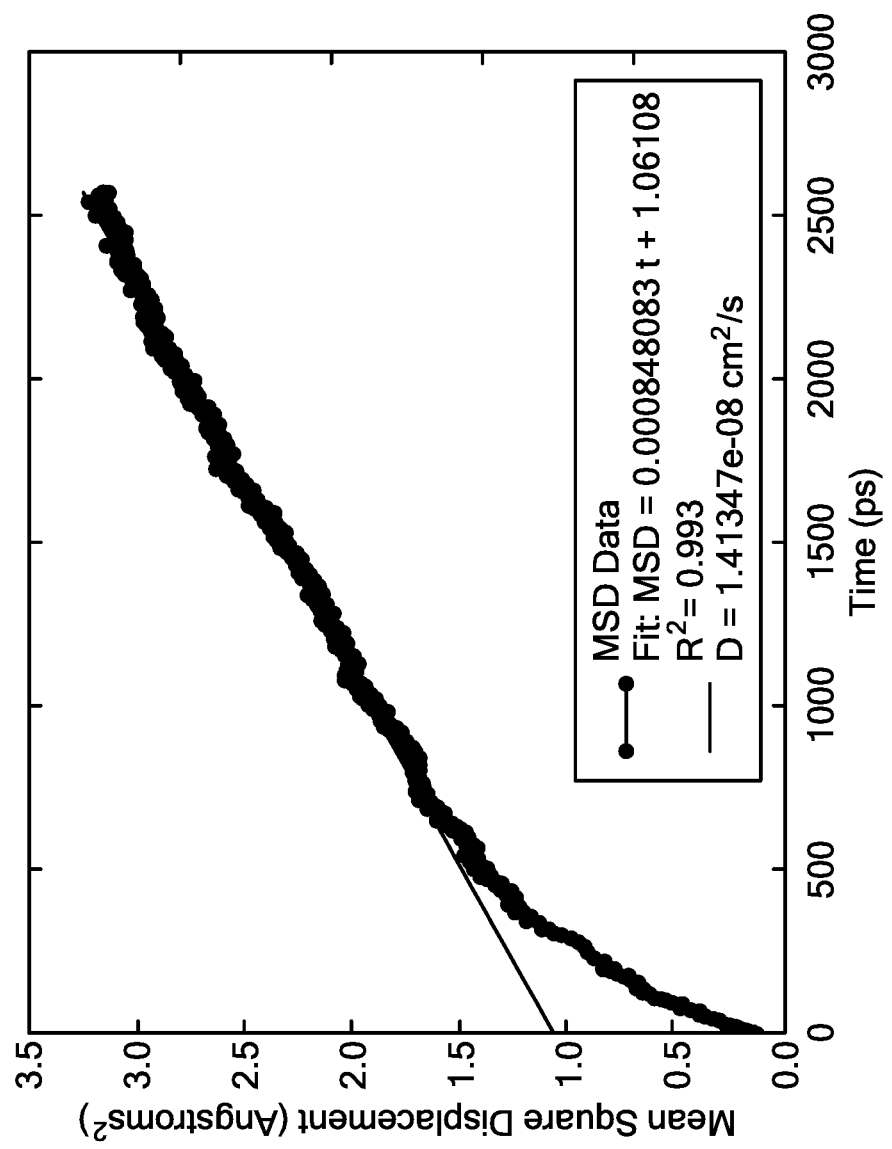
FIG. 16 is a plot of a mean-square-distribution ("MSD") fit to determine a diffusion coefficient in a simulated YBCO lattice at 800 K.

The total MSD was plotted vs. time in order to determine the diffusion coefficient. Once the system has reached equilibrium, the MSD should be linear with time, and the diffusion coefficient can be determined from Einstein's relation:

$$\langle r^2(t) \rangle = B + 6D\Delta t \quad (8)$$

where B is a constant, D is the total self-diffusion coefficient, and $\Delta t$ is the time elapsed. In order to determine statistically significant results, a large (i.e. greater than 1 Angstrom) total MSD is required, requiring long simulation times, even at high temperatures where the Brownian motion due to thermal vibrations is increased. In order to make the simulations computationally tractable, the simulation volume was reduced to a 10×10×4 cell and simulations were only possible for temperatures of 700 K and above. FIG. 16 displays the results of an 800 K MSD simulation to a time of 2500 ps. The first about 500-1000 ps are not in equilibrium, as can be seen from the non-linear slope of the MSD. Thus, the fit to Equation 8 was not applied until time t>1000 ps.

Calculation of Diffusion Coefficients

Using the method described above, the atomic diffusion coefficients for oxygen (the fastest-diffusing atom in YBCO) were determined for temperatures of 700, 800, 900, and 1000 K. As mentioned above, long computation times made it impossible to directly determine lower temperature diffusion coefficients, but since diffusion coefficients follow an exponential relationship with temperature, the higher-temperature diffusion coefficients can be plotted vs. temperature and fit with a curve used to extrapolate down to the lower temperature diffusion coefficients with acceptable accuracy.

The fit can be used to extrapolate down to temperatures currently inaccessible with molecular dynamics modeling due to the computationally intractable simulation times required. The results of extrapolation down to the irradiation temperatures disclosed herein are presented in the table below and show an enormous (17 order of magnitude) decrease in the diffusion coefficient value between the experimental heated (423 K) and cryogenic (80 K) irradiations. Additionally, an extrapolation down to 20K shows a diffusion coefficient nearly 100 additional orders of magnitude smaller than at 80 K. This finding clearly motivates "sub-cooling" REBCO magnets operating in a radiation environment to suppress radiation-enhanced diffusion damage to grain boundaries.

| Temperature | Diffusion Coefficient |
|---|---|
| 20K | $5.9 \times 10^{-137}$ cm$^2$/s |
| 80K | $3.1 \times 10^{-38}$ cm$^2$/s |
| 423K | $1.6 \times 10^{-11}$ cm$^2$/s |

It is worth re-iterating that the results in this table are extrapolations which are themselves based on simulations of an ideal material with several approximations. Thus, the absolute values presented above are very rough approximations of the true oxygen diffusion coefficient in the REBCO which was irradiated. However, the large relative difference between the cryogenic and heated irradiations points to greatly enhanced radiation-assisted diffusion at the higher temperature, which is consistent with the hypothesis that enhanced grain boundary disordering occurs at higher temperature irradiations due to increased diffusion of defects to the grain boundaries which act as sinks to the defects.

Over a given time t, the distance d that a particle will diffuse can be approximately given as:

$$d \approx \sqrt{Dt} \quad (9)$$

The high fluence ($5 \times 10^{16}$ p/cm$^2$) irradiations took approximately 80 minutes (4800 s). Using this time, the approximate average diffusion distances for the 80 K and 423 K irradiations can be calculated. At 423 K, d=2.8 μm, which is on the order of the grain size in modern REBCO conductors. However, at 80 K, d=$1.2 \times 10^{-9}$ A, which is much smaller even than the width of an oxygen atom, meaning that widening of the boundaries of the crystalline grains due to diffusion has been effectively eliminated. While these numbers are approximations, they illustrate the extreme differences between diffusion at the two different irradiation temperatures.

It is appreciated that the amount of grain boundary widening is a function of the diffusion coefficient, which is itself a function of the irradiation temperature. Thus, the amount of grain boundary widening may be controlled by choosing the irradiation temperature. Moreover, it is appreciated that effectiveness of elimination of grain boundary widening may be calculated as a ratio between an actual widening distance and a grain size (e.g. as measured by TEM). For purposes of this disclosure, grain boundary widening is "effectively eliminated" when this ratio is below a predetermined design threshold, which may be (for example) 10%, 5%, 1%, 0.1%, or other percentage of grain size. Alternately, grain boundary widening is "effectively eliminated" when the absolute magnitude of the diffusion distance is below a predetermined design threshold, which may be (for example) 1 μm, 100 nm, 10 nm, 1 nm, 0.1 nm, or other distance.

The results of this section and the previous section analyzing Frenkel pair generation both support the experimental evidence for grain-boundary disorder as the dominant mechanism limiting Jc transport for REBCO irradiated at high temperatures.

Embodiment of Results in a REBCO Tape

Figure 17:
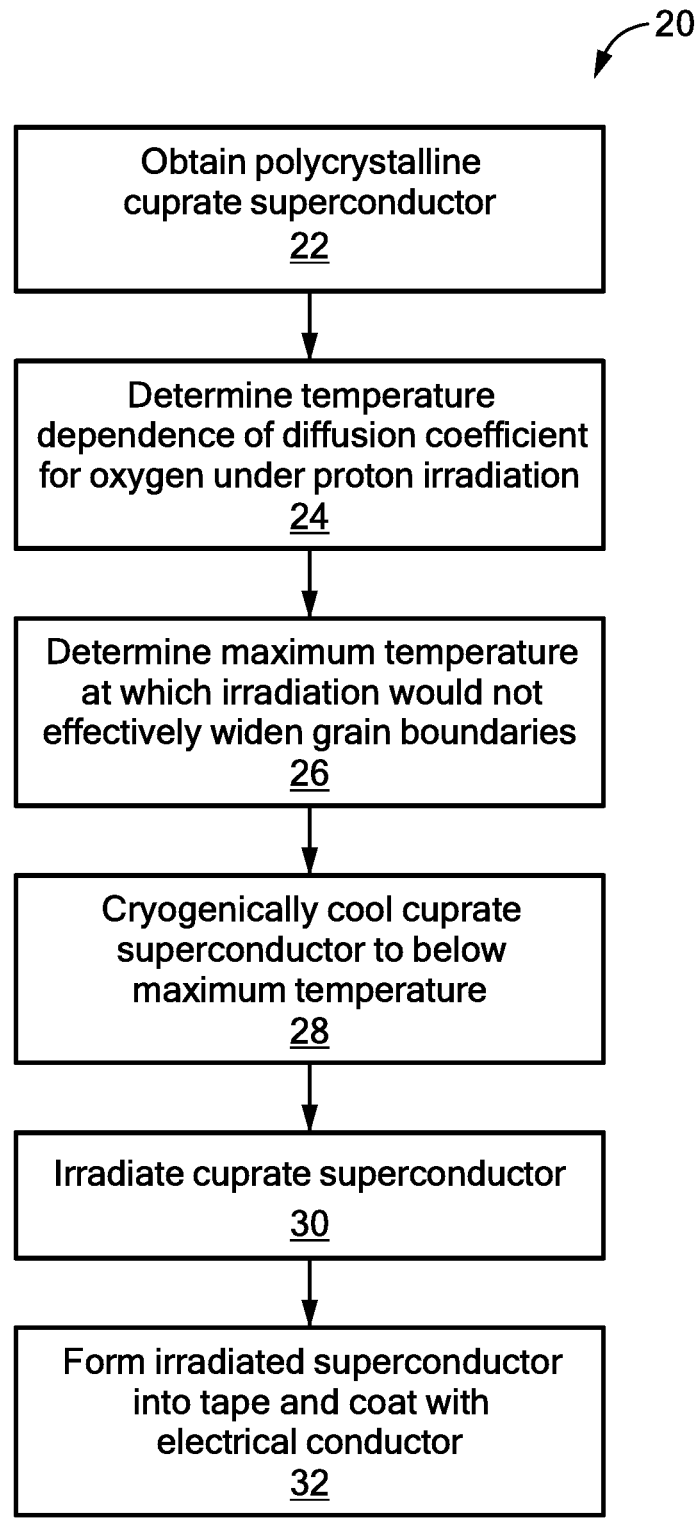
FIG. 17 is a flowchart for an illustrative process for manufacturing a REBCO tape according to an embodiment.

In accordance with the above results, FIG. 17 is a flowchart for an illustrative method 20 according to an embodiment for manufacturing a superconductor having enhanced critical current density in operating conditions of high magnetic fields and high-energy neutron radiation.

The method 20 begins with a process 22 of obtaining a polycrystalline cuprate superconductor. The choice of superconductor may be application specific; for example, a highly grain-aligned REBCO superconductor (i.e., a rare-earth cuprate or another ceramic superconductor that may or may not include barium) may be used. It is appreciated that, as discussed above, the polycrystalline superconductor should at least include a substantial atomic fraction of oxygen that can be efficiently displaced by irradiation.

In process 24 the method determines a temperature dependence of a diffusion coefficient for oxygen in the superconducting lattice when subjected to irradiation. This determination process 24 may be implemented by consulting existing tables of such diffusion coefficients, by direct (but routine) experimental observations, by molecular dynamics simulations, or by other techniques known in the art. It is appreciated that, given how many orders of magnitude the coefficient changes between room temperature irradiations and cryogenic irradiations, an exact value for the diffusion coefficient need not be determined, but rather an approximate relationship between the coefficient and temperature sufficient to accomplish the next process 26.

In process 26 the method determines, at least in part on the basis of the physical properties of the superconductor, a maximum temperature at which proton irradiation to a given fluence would not effectively widen grain boundaries. That is, given a mean grain boundary diameter of the superconductor and an irradiation time for the given fluence, calculate the maximum tolerable diffusion coefficient using equation (9) or similar means known in the art, then compare this maximum tolerable diffusion coefficient against the relationship determined in process 24 to identify an approximate maximum tolerable irradiation temperature. The given fluence itself may be determined to maximize a critical current density Jc in the irradiated superconductor when operating in a condition in which weak magnetic flux pinning dominates strong pinning.

In process 28 the method includes cryogenically cooling the cuprate superconductor to below the maximum tolerable irradiation temperature. For example, in some embodiments the maximum tolerable irradiation temperature is at least 77.36 K (the boiling point of liquid nitrogen), such as 80 K, so in these embodiments process 28 includes cooling using liquid nitrogen. In other embodiments, the maximum tolerable irradiation temperature may be lower than 80 K, so other cryogens such as liquid neon, liquid hydrogen, or supercritical or liquid helium may be used during irradiation. In some cases, cooling below the maximum tolerable irradiation temperature may be achieved without liquid cryogen and instead employing conduction cooling.

In process 30 the method includes cryogenically irradiating the cuprate superconductor to a given fluence. Irradiation may be performed using apparatus and techniques known in the art, for example as described below. In some particularly advantageous embodiments, the irradiating process 30 produces at least 0.003 oxygen displacements per atom (DPA) of the lattice. Irradiation may thereby produce at least one weak pinning site within the superconductor, ideally many such pinning sites, thereby improving its critical current density under operating conditions of high magnetic fields and high-energy neutron irradiation without degrading critical current density via widening of the superconducting grain boundaries.

Figure 2:
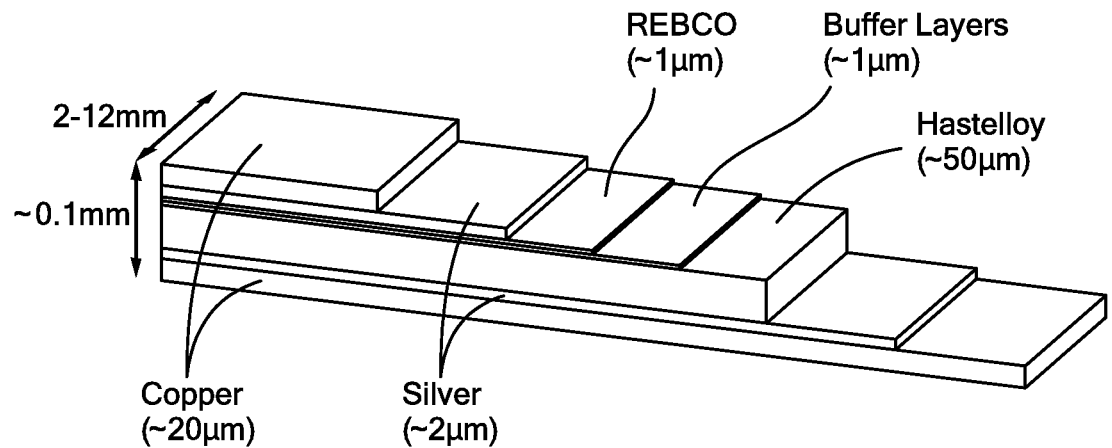
FIG. 2 shows a cross-section of the layers of an illustrative coated-conductor REBCO tape.
Figure 3:
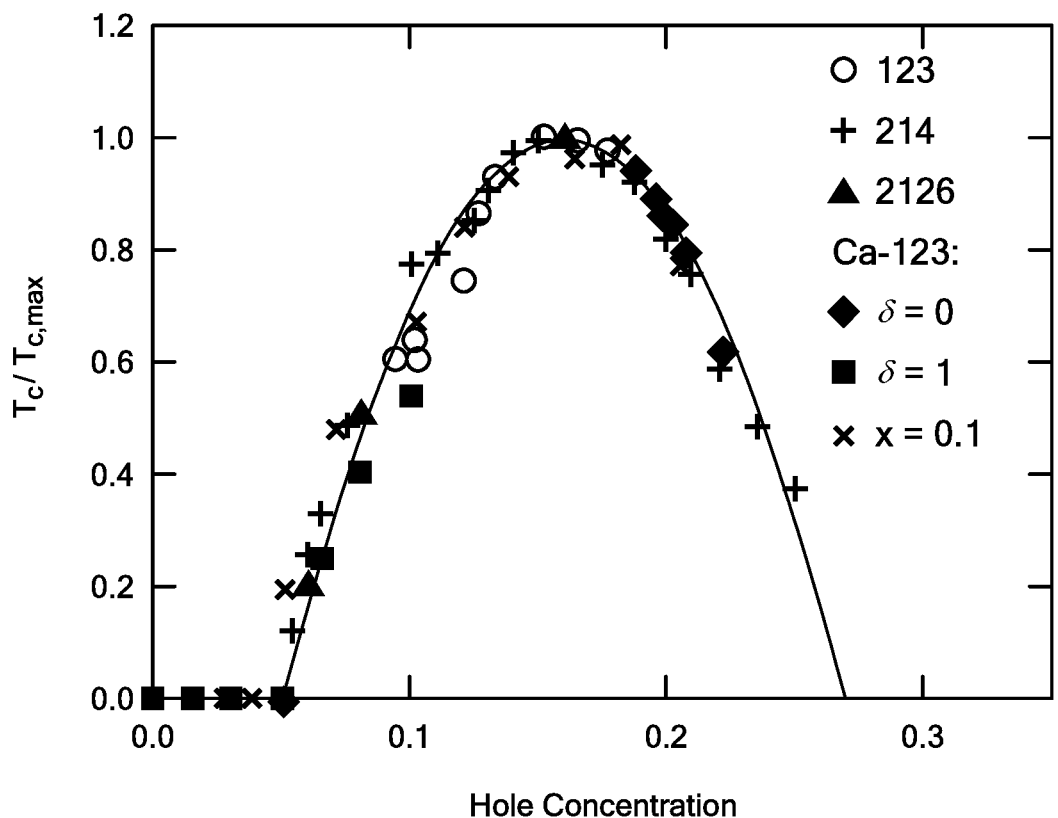
FIG. 3 is a plot of normalized critical temperature (Tc) dependence on hole concentration for a wide variety of cuprate superconductors.
Figure 4:
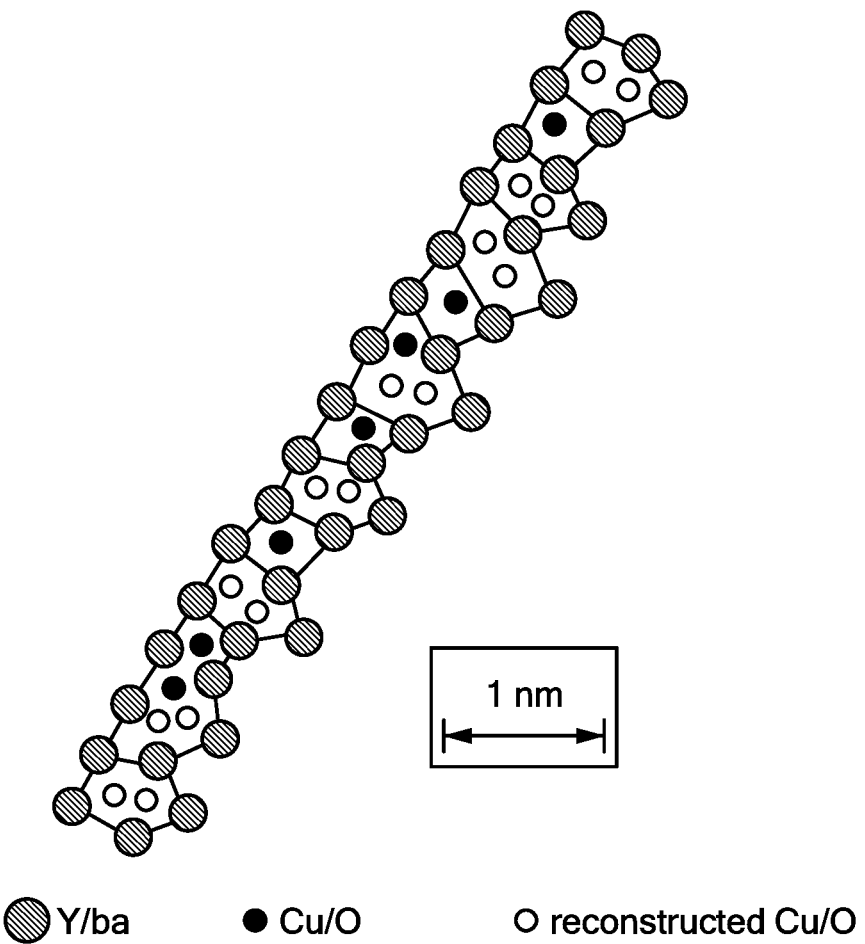
FIG. 4 shows a TEM image of an illustrative YBCO superconductor.

Some applications require the superconductor to be used in a tape format. Thus, the method 20 may be extended in a process 32 to form the irradiated superconductor into a tape and coat it with at least one electrical conductor to form a structure similar to (or the same as) that of FIG. 2. Alternately, the cuprate superconductor may be obtained in process 22 already in a tape configuration.

One particularly advantageous application of the above-described concepts, techniques, and structures uses such a coated-conductor tape as the toroidal field coils of a compact nuclear fusion reactor. Thus, the tape may be wound around a chamber for fusing nuclei of a heated plasma. The field coils are operated by cryogenically cooling the tape to below a critical temperature for the (previously irradiated) superconductor, then passing an electrical current through the coated-conductor tape, thereby generating a magnetic field suitable for confining the plasma in the chamber.

Irradiation Apparatus

In order to investigate the effect of irradiation temperature on REBCO degradation, ion irradiations of 2 G REBCO samples from SuperPower were performed at the DANTE linear tandem accelerator facility at MIT using a 1.2 MeV proton beam. While the primary-knock-on (PKA) energy spectrum of protons on YBCO is much lower than that of neutrons in YBCO, protons have a much lower stopping power in YBCO than heavier ions and can be considered approximately mono-energetic in the superconducting layer. Monte Carlo calculations performed with SRIM, described above, show that the beam will slow down 200 keV in the 2 μm silver cap layer and the average proton energy is approximately constant. This is in contrast to heavier ions which have a strongly increasing energy to recoils deeper into the layer, effectively producing different damage in different depths of the superconductor.

Effort was taken to ensure uniform areal irradiation over the entire sample. Critical current measured using the four-probe transport method is limited by the most damaged region on the tape, so any irradiation "hot spots" caused by uneven beam coverage would have resulted in artificially low critical current measurements. To ensure beam uniformity, the proton beam profile was first determined by performing intensity analysis of a CCD image of the beam on a gold-coated quartz window the same distance in beam drift space as the REBCO target holder in an adjacent beamline. The beam focus was adjusted so that the beam spot size at 75% of peak intensity was large enough to cover the entire HTS target area.

Figures 18A, 18B:
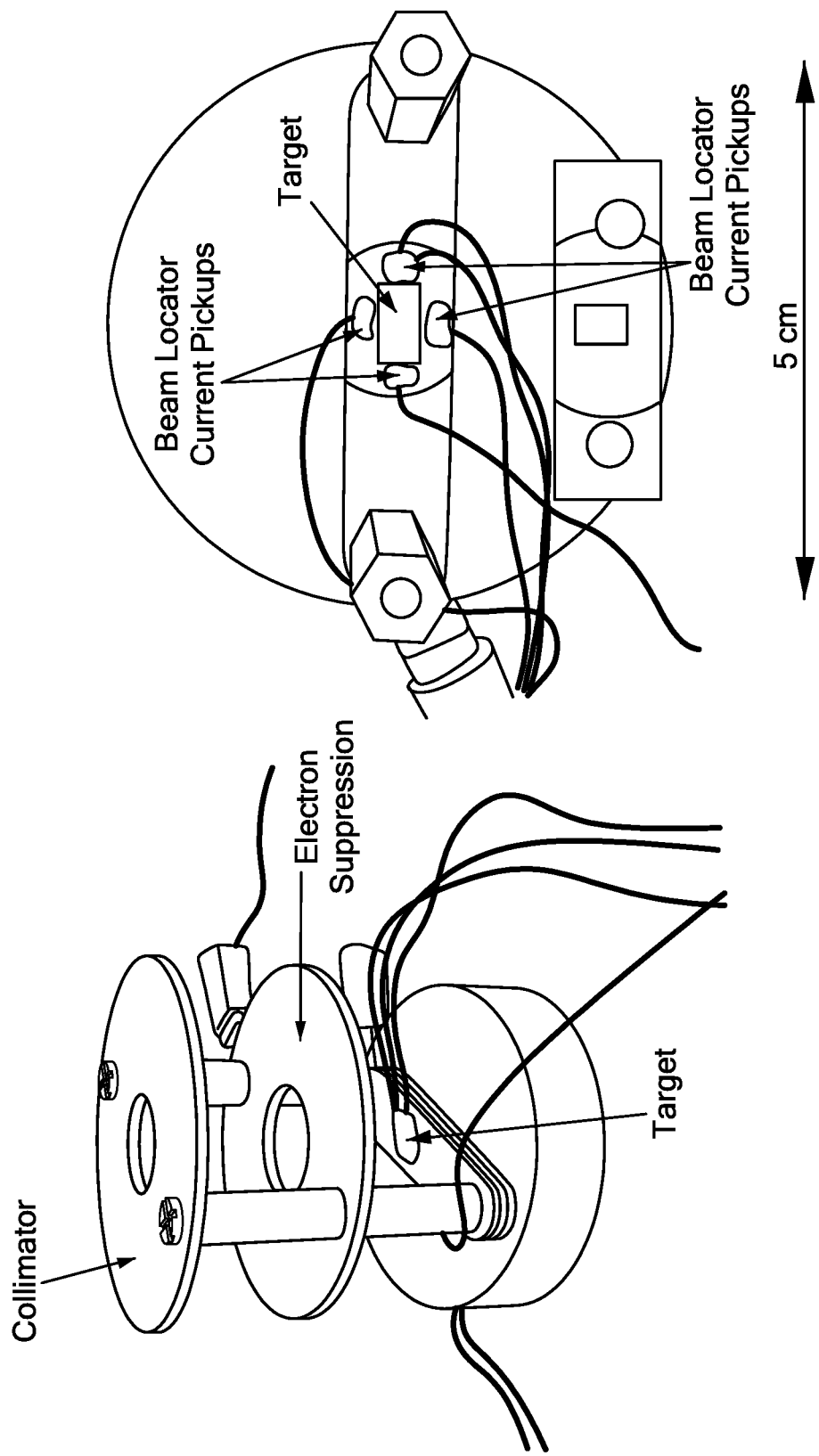
FIG. 18A depicts a target mount for irradiating an HTS, showing a first collimator at top, then an electron suppression electrode, then a secondary G-10 collimator mount at bottom.
FIG. 18B is a close-up of the target area with the collimator and suppression electrode removed, showing the current pickups used to center the beam on target during operation.

After a satisfactory beam spot was achieved, the beam was steered onto the REBCO sample holder, where it passed through a set of collimators before impinging on the REBCO target (see FIG. 18A). The first collimator was slightly larger than the desired target outline and removed the heat load from the unused portions of the beam. The second collimator, constructed from G-10, outlined the 6×4 mm irradiation area on the REBCO and had four copper pickups at the edge of each side of the opening to measure instantaneous beam current (see FIG. 18B). The beam was centered on target by ensuring that the measured beam currents were the same on opposing sides of the rectangular collimator opening. The typical instantaneous beam current value on the HTS tape was 300 nA. The sample holder was affixed to a conduction-cooled cryogenic stage capable of reaching temperatures as low as 80 K and was instrumented with cartridge heaters allowing the sample to be heated as well. The cartridge heaters were controlled using a digital proportional-integral-derivative (PID) controller using feedback from thermocouples attached to the sample directly next to the irradiated area, allowing sample temperature to be maintained in the range of 80 K to 423 K±3 K when the beam was on target. During all irradiations, vacuum conditions in the chamber were kept between $10^{-7}$ and $10^{-6}$ Torr. A secondary electron suppression electrode biased to −200 V was used to ensure accurate beam current (and thus accurate fluence) measurements.

Critical Current Analysis with the SuperCurrent Measurement System

In order to achieve a large scan of high-fidelity measurements, the accelerator-irradiated samples were brought to the Robinson Research Institute (RRI) in New Zealand for analysis with their automated SuperCurrent measurement system. The SuperCurrent can be operated in automatic mode, sweeping through the desired set of fields (from 0-8 T), temperatures (15-90 K), and field angles (0-180 degrees), and obtaining the V-I transport curves at each combination. Operating in this fashion, the RRI SuperCurrent collected approximately 18,000 Ic measurements of the irradiated and control samples.

Repeatability of Measurements and Error Analysis

In order to reduce sample variability due to manufacturing processes, all samples were taken from a continuous 3-meter length to ensure that the processing conditions were as similar as possible. To remove the effect of remaining variations, a full characterization of the experimental tape spool critical current was obtained. Since magnetic hysteresis Ic measurements rely on the interpretation of a theoretical model, they cannot give an absolute measurement of Ic and must be calibrated against a transport measurement. However, relative Ic measurements can be used to normalize the "initial" critical current from the length if the position of each sample from the 3-meter length is known. In order to apply this correction factor, the position of the control sample was chosen to be the "standard" critical current, and all other currents were scaled relative to this value.

Although error bars are generally not reported for critical current measurements, an attempt was made to quantify uncertainty in the measurements. Repeat measurements of the same sample were performed to establish measurement uncertainty of the SuperCurrent device. Although it would be infeasible to take multiple repeat measurements to calculate error bars individually for each Jc measurement, a dedicated scan was performed on one sample multiple times.

The three values of Jc for each measurement condition (field, temperature, and field angle) were averaged, and the standard deviation of the group was computed. The calculated standard deviations were relatively consistent across all angles, fields, and temperatures, with the exception of the 7 T, 30 K measurements around 90 degrees. The explanation for this is most likely due to the high Lorentz forces on the sample at the high current and field bending the sample so that it is not flat with the Hall sensor mounted inside the sample rod. Due to the sharp peak in Ic around 90 degrees, even a small discrepancy between the measured Hall angle the actual angle of the sample with the field could cause a large discrepancy between two measurements. Unfortunately, it was impossible to measure sample deflection during a measurement, so the only way to correct for this error is to compare full angular scans between measurements and note when the 90-degree peaks are shifted. In order to establish error bars for the critical current measurements, the standard deviations were averaged to yield global standard deviation of 1.3%, which was applied to the data analysis above.

Conclusion

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. A method comprising:
choosing a cryogenic irradiation temperature to effectively eliminate widening of boundaries of crystalline grains of a polycrystalline superconductor caused by diffusion of radiatively displaced atoms; and
irradiating the superconductor with ionic matter or neutrons while the superconductor is at the chosen cryogenic irradiation temperature.

2. A method according to claim 1, wherein the superconductor comprises a rare-earth copper oxide superconductor.

3. A method according to claim 1, wherein the cryogenic irradiation temperature is at most 80 K.

4. A method according to claim 1 further comprising choosing an irradiation fluence that maximizes a critical current density in the irradiated superconductor when operating in a condition in which weak magnetic flux pinning dominates strong magnetic flux pinning.

5. A method according to claim 1, wherein irradiating comprises producing at least 0.003 displacements per atom.

6. A method according to claim 1, wherein irradiating forms at least one weak pinning site within the superconductor.

7. A method according to claim 1, further comprising providing the irradiated superconductor as a tape coated with at least one electrical conductor.

8. A method according to claim 7, further comprising winding the coated tape around a chamber for fusing nuclei of a plasma.

9. A method according to claim 8, further comprising cryogenically cooling the wound tape and passing an electrical current through the tape, thereby generating a magnetic field suitable for confining the plasma in the chamber.

10. A method according to claim 9, wherein cryogenically cooling the wound tape includes cooling to a temperature of approximately 20 K.

11. A method according to claim 1, wherein irradiating the superconductor with ionic matter or neutrons comprises irradiating the polycrystalline superconductor with ions.

12. A method according to claim 11, wherein the ions include protons.

13. A method according to claim 1, comprising arranging the polycrystalline superconductor in the path of an ion beam, and activating the ion beam so that ions from the ion beam are incident on the at least a portion of the polycrystalline superconductor.

14. A method according to claim 13, wherein the ion beam is a proton beam.

15. A method according to claim 1, wherein irradiating the superconductor with ionic matter or neutrons comprises irradiating the polycrystalline superconductor with neutrons.

16. A method according to claim 15, comprising arranging the polycrystalline superconductor within a nuclear fusion reactor prior to said irradiation of the polycrystalline superconductor.

17. A method according to claim 1, wherein irradiating the superconductor with ionic matter or neutrons is performed within a vacuum chamber.

18. A method according to claim 1, wherein the polycrystalline superconductor is a grain-aligned polycrystalline superconductor.

* * * * *